US010804227B2

(12) United States Patent
Kamgaing et al.

(10) Patent No.: US 10,804,227 B2
(45) Date of Patent: Oct. 13, 2020

(54) SEMICONDUCTOR PACKAGES WITH ANTENNAS

(71) Applicant: Intel Corporation, Santa Clara, CA (US)

(72) Inventors: Telesphor Kamgaing, Chandler, AZ (US); Adel A. Elsherbini, Chandler, AZ (US); Sasha N. Oster, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/312,904

(22) PCT Filed: Jul. 1, 2016

(86) PCT No.: PCT/US2016/040828
§ 371 (c)(1),
(2) Date: Dec. 21, 2018

(87) PCT Pub. No.: WO2018/004684
PCT Pub. Date: Jan. 4, 2018

(65) Prior Publication Data
US 2019/0333882 A1    Oct. 31, 2019

(51) Int. Cl.
*H01L 23/66*    (2006.01)
*H01L 21/48*    (2006.01)
(Continued)

(52) U.S. Cl.
CPC .......... *H01L 23/66* (2013.01); *H01L 21/4857* (2013.01); *H01L 23/49822* (2013.01);
(Continued)

(58) Field of Classification Search
None
See application file for complete search history.

(56) References Cited

U.S. PATENT DOCUMENTS

2010/0164671 A1    7/2010  Pagani et al.
2010/0327068 A1    12/2010 Chen et al.
(Continued)

OTHER PUBLICATIONS

International Search Report and Written Opinion for PCT Application No. PCT/US2016/040828, dated Apr. 26, 2017, 11 pages.
(Continued)

*Primary Examiner* — Bo B Jang
(74) *Attorney, Agent, or Firm* — Patent Capital Group

(57) ABSTRACT

In various embodiments, disclosed herein are systems and methods directed to the fabrication of a coreless semiconductor package (e.g., a millimeter (mm)-wave antenna package) having an asymmetric build-up layer count that can be fabricated on both sides of a temporary substrate (e.g., a core). The asymmetric build-up layer count can reduce the overall layer count in the fabrication of the semiconductor package and can therefore contribute to fabrication cost reduction. In further embodiments, the semiconductor package (e.g., a millimeter (mm)-wave antenna packages) can further comprise dummification elements disposed near one or more antenna layers. Further, the dummification elements disposed near one or more antenna layers can reduce image current and thereby increasing the antenna gain and efficiency.

18 Claims, 13 Drawing Sheets

(51) Int. Cl.
  *H01L 23/498*    (2006.01)
  *H01L 23/00*     (2006.01)
  *H01Q 1/36*      (2006.01)
  *H01Q 9/04*      (2006.01)
  *H01Q 9/16*      (2006.01)
  *H01Q 9/30*      (2006.01)

(52) U.S. Cl.
  CPC ........ *H01L 23/49827* (2013.01); *H01L 24/16* (2013.01); *H01L 2223/6677* (2013.01); *H01L 2224/16225* (2013.01); *H01Q 1/36* (2013.01); *H01Q 9/0407* (2013.01); *H01Q 9/16* (2013.01); *H01Q 9/30* (2013.01)

(56) References Cited

U.S. PATENT DOCUMENTS

| | | |
|---|---|---|
| 2011/0076472 A1 | 3/2011 | Kim et al. |
| 2013/0059551 A1 | 3/2013 | Ginsburg et al. |
| 2013/0207274 A1 | 8/2013 | Liu et al. |
| 2014/0035097 A1 | 2/2014 | Lin et al. |
| 2014/0145883 A1 | 5/2014 | Baks et al. |
| 2015/0207216 A1 | 7/2015 | Fujita et al. |
| 2015/0325925 A1 | 12/2015 | Kamgaing et al. |

OTHER PUBLICATIONS

European Supplementary Search Report for European Application No. 16907634.6, dated Jan. 31, 2020, 8 pages.

SEMICONDUCTOR PACKAGES WITH ANTENNAS

CROSS-REFERENCE TO RELATED APPLICATIONS

This application is a U.S. National Stage Application under 35 U.S.C. 371 and claims the priority benefit of PCT International Application No. PCT/US2016/040828, filed Jul. 1, 2016, the disclosure of which is incorporated herein by reference as if set forth in full.

TECHNICAL FIELD

This disclosure generally relates to semiconductor packages and more particularly to semiconductor packages with antennas.

BACKGROUND

The integration of antennas on semiconductor packages may be important for wireless devices; for example, devices using cellular and/or wireless networks (for example, 4G and 5G cellular and WiFi/WiGig networks). Further, antennas on semiconductor packages that can operate at millimeter-wave frequencies may be important in applications involving sensing, radar, ultra-high-speed communication, and biomedical imaging. Next generation wireless communication devices may use millimeter-wave frequencies to address the increasing demand for data, making such packaging even more desirable.

BRIEF DESCRIPTION OF THE FIGURES

Reference will now be made to the accompanying drawings, which are not necessarily drawn to scale, and wherein.

DETAILED DESCRIPTION OF EXAMPLE EMBODIMENTS

Figure 1:
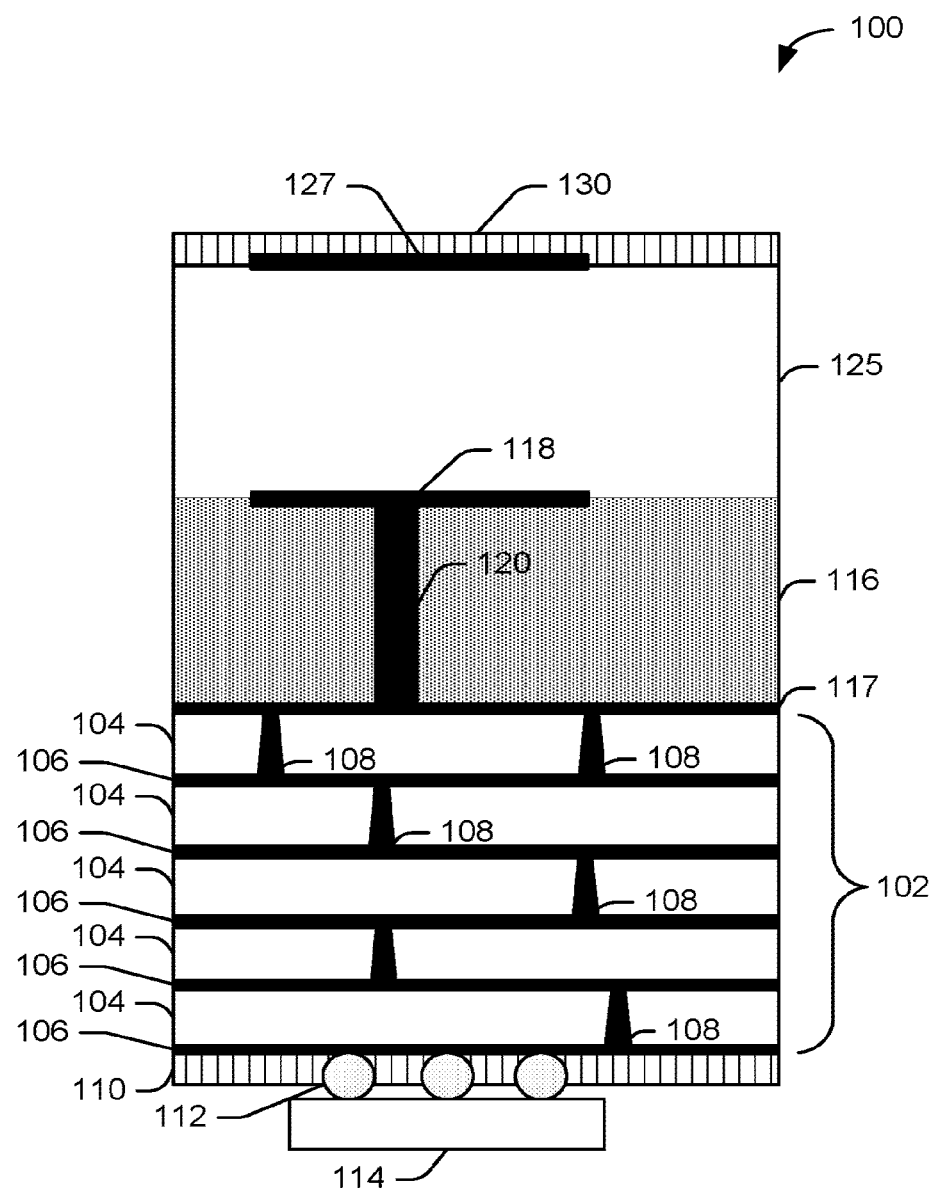
FIG. 1 shows a simplified diagram of an example cross-section of a semiconductor package (e.g., a millimeter (mm)-wave antenna package) in accordance with example embodiments of the systems and methods disclosed herein.

Embodiments of the disclosure are described more fully hereinafter with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete and will fully convey the scope of the disclosure to those skilled in the art. Like numbers refer to like but not necessarily the same or identical elements throughout.

Wireless communication devices may substantially use millimeter-wave frequencies to address the increased demand for data. Antennas may be integrated on a semiconductor package (e.g., a millimeter (mm)-wave antenna package) for use with many frequencies of interest to wireless communication networks. Many organic packages used for millimeter-wave devices today can use symmetric and/or cored substrates in addition to solid planes around the antenna elements. However, cored substrate may be expensive, for example, due to metal voiding requirements associated with increased antenna bandwidth. Further, solid ground planes around antennas can generate surface current and can thereby reduce antenna efficiency. In addition, the omission of metal between antenna patches can lead to substrate warpage; for example, during fabrication, assembly, and reliability tests.

In various embodiments, disclosed herein are systems and methods directed to the fabrication of a semiconductor package (e.g., a millimeter (mm)-wave antenna package) having an asymmetric build-up layer count and which can be fabricated on both sides of a temporary substrate (e.g., a core). The asymmetric build-up layer count may reduce the overall layer count in the fabrication of the semiconductor package and can therefore contribute to cost reduction. In further embodiments, the semiconductor package (e.g., a millimeter (mm)-wave antenna package) can further comprise dummification elements disposed near one or more antenna elements. Further, the dummification elements disposed near one or more antenna elements can reduce image current associated with the antenna elements and thereby increasing the antenna gain and efficiency. Additionally, the dummification elements disposed near one or more antenna elements can provide mechanical robustness, therefore reducing semiconductor package warpage. For example, the dummification elements can be disposed in a coplanar manner around the antenna elements (e.g., in the same layer) to reduce surface current and provide mechanical robustness. In one embodiment, the dummification elements disposed near one or more antenna elements can also be used in connection with one or more transmission lines; for example, transmission lines that can be used in the semiconductor package to route one or more signals between a die and an antenna. This can, for example, increase the isolation between feed lines used in phased array antenna applications. In various embodiments, a predetermined distance can be maintained between one or more dummification elements disposed near one or more antenna elements, for example, in order to reduce antenna loading. In addition, the dummification elements disposed near one or more antenna elements may be sized and arranged in such a way that any dielectric layers disposed near the antenna elements can serve as high impedance mediums and/or as reflectors of in-substrate radiation.

Embodiments of the disclosure are described more fully hereinafter with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete and will fully convey the scope of the disclosure to those skilled in the art. Like numbers refer to like but not necessarily the same or identical elements throughout.

The following embodiments are described in sufficient detail to enable at least those skilled in the art to understand and use the disclosure. It is to be understood that other embodiments would be evident based on the present disclosure and that process, mechanical, material, dimensional, process equipment, and parametric changes may be made without departing from the scope of the present disclosure.

In the following description, numerous specific details are given to provide a thorough understanding of various embodiments of the disclosure. However, it will be apparent that the disclosure may be practiced without these specific details. In order to avoid obscuring the present disclosure, some well-known system configurations and process steps may not be disclosed in full detail. Likewise, the drawings showing embodiments of the disclosure are semi-diagrammatic and not to scale and, particularly, some of the dimensions are for the clarity of presentation and may be exaggerated in the drawings. In addition, where multiple embodiments are disclosed and described as having some features in common, for clarity and ease of illustration, description, and comprehension thereof, similar and like features will ordinarily be described with like reference numerals even if the features are not identical.

The term "horizontal" as used herein may be defined as a direction parallel to a plane or surface (e.g., surface of a substrate) regardless of its orientation. The term "vertical" as used herein may refer to a direction orthogonal to the horizontal direction as just described. Terms such as "on," "above," "below," "bottom," "top," "side" (as in "sidewall"), "higher," "lower," "upper," "over," and "under," may be referenced with respect to the horizontal plane. The term "processing" as used herein includes deposition of material or photoresist, patterning, exposure, development, etching, cleaning, ablating, polishing, and/or removal of the material or photoresist as required in forming a described structure.

The antenna package, alternatively or additionally referred to as a semiconductor package, a millimeter-wave package, and/or an antenna millimeter-wave package, may have radiating elements of an antenna provided thereon, for example, in the form of one or more antenna elements. The antenna elements may be of any suitable type, such as patch antennas, stacked patches, dipoles, monopoles, etc., and may have different orientations and/or polarizations. In some example embodiments, an antenna may further be implemented as a surface mounted antenna.

In example embodiments, the antenna package may be constructed of various materials. For example, the antenna package may use higher dielectric constant (high-k)/tunable/ultra-low-k/metamaterials/magnetic materials. In some embodiments, the antenna package may have pockets of air (e.g., airgaps) that may enhance antenna performance.

In example embodiments, the antenna package may have one or more cavities, such as cavities formed in various build-up layers, to accommodate the electrical components disposed on the antenna package. The cavities may be formed by having routing exclusion zones where a portion of the build-up layers may be removed, such as by laser ablation, controlled depth drilling, or other suitable mechanisms.

The antenna elements of the antenna package may radiate and/or receive electromagnetic signals from a location of space that may be substantially non-overlapping. In other example embodiments, two different signals or set of signals may be transmitted and/or received from the antenna elements of the antenna package.

In some example embodiments, the antenna package may have one or more connectors, such as AFL connectors, disposed thereon. It may be via these connectors that the antenna package may communicate signals to and/or from external entities. In some example embodiments, there may be both package-to-board (e.g., Ball Grid Array (BGA), land grid array (LGA), etc.) connections and one or more connectors disposed on the antenna package. The connectors may be coupled to the antenna package by any suitable mechanism, such as copper pillar, flip chip, solder bumps, anisotropic conductive films (ACF), and the like.

According to example embodiments, the antenna package may include a substrate. Alternatively or additionally, the fabrication of the antenna package may involve a substrate. In one embodiment, the substrate may be a temporary substrate used in the fabrication of the antenna package. In some cases, the substrate may be an organic structure. In other cases, the substrate may be inorganic (e.g., ceramic, glass, semiconducting material, etc.). The substrate may, in example embodiments, include a core layer with one or more interconnect layers built up on one or both sides of the core layer. The build-up layers, as built up on the core, may have interconnects, or traces, formed therein. The traces may provide electrical pathways for signals between electronic components (e.g., integrated circuits, passive devices, etc.), input/output (I/O) connections on the antenna package, signal fan out from/to the electronic components, signal connections between two or more electrical components, power delivery to electrical component(s), ground connections to electrical component(s), clock signal delivery to the electrical component(s), combinations thereof, or the like.

Furthermore, the antenna package may have a plurality of through vias, for example, to make electrical connections from one side of the core to the other side of the core or to make electrical connections from one build-up layer to another buildup layer; for example, in a dielectric redistribution layer (RDL) stack. Further, through vias in the core may allow electrical connections between one or more build-up layers on the top of the semiconductor package to one or more build-up layers on the bottom of the semiconductor package. In some alternative embodiments, a coreless substrate may be used where the semiconductor package may not have a core. The layers in the substrate can be disparate and of different thicknesses. It is possible for such a package to have components embedded in them, such as bare or pre-packaged dies and/or other SMT components.

In an example embodiment, the antenna package may have a mechanism for radiating electro-magnetic signals (e.g., RF wireless signals). The antenna package may have one or more antenna elements (e.g., radiating elements) disposed thereon that may radiate the wireless signals.

Additionally, the antenna package may have radiative reception elements that may receive electro-magnetic signals that may be routed to one or more devices (e.g., to RFICs disposed on the antenna package). In some example embodiments, the antenna package may include a single interconnect layer having both the coupling elements (e.g., pads) to the semiconductor package and the antenna elements receiving and/or transmitting radiative elements. Further, in various embodiments, the antenna elements (e.g., radiating elements) may be used to both receive and transmit using frequency or time domain division or multiplexing.

In various embodiments, the antenna packaging may implement a phased array using one or more antenna elements. In various embodiments, the phased array can include an array of antenna elements in which the relative phases of the respective signals feeding the antenna elements are set in such a way that the effective radiation pattern of the array is reinforced in a desired direction and suppressed in undesired directions. In another embodiment, the phased array can transmit amplified signals with various phase shifts in the antenna element (or group of elements).

The antenna package may comprise various layers. The layers can use one or both of low-k and high-k build-up layers, depending on whether the antenna package may have antenna radiating elements disposed thereon. For example, if the antenna package primarily serves a purpose of routing signals between electronic components disposed on the antenna package, then one or more of the build-up layers may use low-k materials to reduce parasitics. However, high-k dielectric build-up materials may also be utilized in constructing the antenna package.

In one embodiment, the antenna package can be used at various frequencies of operation, with example frequencies ranging from approximately 4 GHz to approximately 300 GHz and with a smaller range of operation from approximately 10 GHz to 80 GHz, and specifically at approximately 24, approximately 28, approximately 39, approximately 60, and approximately 73 GHz.

In example embodiments, thinner dielectric layers may be chosen for portions of the antenna package since they may result in tightly bound fields, minimizing undesired radiation and coupling from transmission lines, and thicker dielectric layers may be chosen for other portions of the antenna package to provide better efficiency, loosely bound fields for improved radiation into space, and/or greater bandwidth. Further still, it will be appreciated that by building smaller package substrates, and by using the structures, apparatus, systems, and methods as disclosed herein, the antenna package may have a smaller area and fewer processes, resulting in potential cost and manufacturing yield advantages.

FIG. 1 shows an example diagram of a cross-sectional view of an antenna package comprising an asymmetric millimeter-wave package 100 in accordance with various example embodiments of the disclosure. In one embodiment, the dielectric redistribution layers 102 can be fabricated using a temporary structure (not shown), for example, a temporary structure comprising a sacrificial layer. The dielectric redistribution layers 102 can include a plurality of dielectric layers 104 and a plurality of metal layers (optionally having a plurality of pads) 106 and a plurality of vias 108. The vias (and/or trenches) 108 may be defined by vertical and horizontal metal traces, respectively, within the dielectric layers 104. The vias and trenches 108 may be filled with metal, such as by electroless metal plating, electrolytic metal plating, physical vapor deposition, combinations thereof, or the like. Excess metal may be removed by any suitable mechanism, such as etch, clean, polish, and/or chemical mechanical polish (CMP), combinations thereof, or the like. Alternatively or additionally, the redistribution layer may include one or more interconnect layers having one or more dielectric layers 104 with one or more metal traces (106 and 108) formed on the one or more dielectric layers 104. The dielectric layers 104 can comprise any suitable dielectric material including, for example, silicon dioxide or any other known oxide. The dielectric layers 104 can further comprise an organic material or polymer material, a prepreg material, a ceramic, a glass, silicone, or any other kind of suitable material. Further, in various aspects, the dielectric materials can comprise a polymer material, ceramic material, plastics, composite materials, liquid crystal polymer (LCP), epoxy laminates of fiberglass sheets, prepreg, FR-4 materials, FR-5 materials, combinations thereof, or the like. The metal layers (optionally having a plurality of pads) 106 can include copper, silver, or any other suitable metal. The number of layers in the dielectric layers 104 and metal layers (optionally having a plurality of pads) 106 comprising the dielectric redistribution layers 102 can be any suitable number and may, in various embodiments, depend on the number of connections to be made by the dielectric redistribution layers 102 and one or more external connections, for example, to power supplies, off-board integrated circuits and/or memory, and the like.

The antenna package (e.g., the asymmetric millimeter-wave package) 100 may further include an interface layer 110 that can alternatively be referred to as a solder mask layer and/or a buildup layer. The interface layer 110 may include a dielectric material or any other suitable material, including but not limited to, any suitable dielectric material, such as silicon dioxide or any other known oxide. The interface layer 110 can further comprise an organic material or polymer material, a prepreg material, a ceramic, a glass, silicone, or any other kind of suitable material. The antenna package (e.g., the asymmetric millimeter-wave package) 100 can further include a ball grade array (BGA) 112; further, the BGA 112 can connect to one or more dies 114. The BGA 112 can include tin, copper, silver, or any other metal, inter-metallic, or hybrid material. The dies 114 can include one or more electronic components, including at least one integrated circuit die. The dies 114 may be electrically and mechanically coupled to the interface layer 110 via any suitable mechanism, such as metal pillars (e.g., copper pillars), flip chip bumps, solder bumps, any type of low-lead or lead-free solder bumps, tin-copper bumps, wire bonds, wedge bonds, controlled collapse chip connect (C4), anisotropic conductive film (ACF), nonconductive film (NCF), combinations thereof, copper pillar, or the like. In some example embodiments, the dies (e.g., integrated circuits) 114, as described herein, may have input/output (I/O) connections for various sizes. Further, the ball grid array (BGA) 112 connections can alternatively or additionally be a land grid array (LGA), other area connections, periphery connections, or the like. Alternatively or additionally, in example embodiments, the semiconductor component, including the dies 114, the dielectric redistribution layer 102, and/or the BGA 112, may have a connector disposed thereon, such as an AFL connector for making connections to cables. The semiconductor component may also be pre-packaged as a wafer level chip scale package (WL-CSP), embedded wafer level ball grid array (e-WLB), or flip chip-chip scale package (FC-CSP). The dies 114 can include any suitable Integrated Circuit (IC), System On A Chip (SoC), or any other electronic device. The interface layer 110 can, in various embodiments, be positioned between the dielectric redistribution layer 102 and the dies 114. The dies 114 can include electronic components, which may be any suitable electronic components including, but not limited to, integrated circuits, surface mount devices, active devices, passive devices, diodes, transistors, connectors, resistors, inductors, capacitors, microelectromechanical systems (MEMSs), combinations thereof, or the like.

In one embodiment, one or more electronic components, including at least one integrated circuit die, may be electrically and mechanically coupled to the interface layer 110, such as by metal pillars (e.g., copper pillars), flip chip bumps, solder bumps, any type of low-lead or lead-free solder bumps, tin-copper bumps, wire bonds, wedge bonds, controlled collapse chip connects (C4), anisotropic conductive film (ACF), nonconductive film (NCF), combinations thereof, or the like. In some cases, underfill (e.g., with or without filler materials) (not shown) may be provided between the dies 114 and the interface layer 110. Underfill epoxy may be dispensed by a nozzle under and/or adjacent to the dies 114. The underfill epoxy may move by capillary action and/or Van der Waals forces to a position under the dies 104. Further, the underfill may or may not have filler materials therein. Representative underfill epoxy materials may include an amine epoxy, imidizole epoxy, a phenolic epoxy, or an anhydride epoxy. Other examples of underfill material include polyimide, benzocyclobutene (BCB), a bismalleimide type underfill, a polybenzoxazine (PBO) underfill, or a polynorborene underfill. Additionally, the underfill epoxy may include one or more suitable filler materials, such as silica. In example embodiments, the underfill epoxy may have fillers and/or other materials therein to preferentially control the coefficient of thermal expansion (CTE), reduce stresses, impart flame retardant properties, promote adhesion, and/or reduce moisture uptake in the underfill epoxy. Additives and/or chemical agents may be included in the underfill epoxy for desirable properties, such as a preferred range of viscosity, a preferred range of tackiness, a preferred range of hydrophobicity (e.g., surface wetting), a preferred range on particle suspension properties, a preferred range of cure temperatures, combinations thereof, or the like.

In various embodiments, the underfill epoxy may be cured to form the underfill between the dies 114 and the interface layer 110. The cure process may include heating and/or radiation (e.g., ultraviolet (UV) cure, and/or combinations thereof). During the cure process, the underfill epoxy may cross-link and harden. Although the underfill epoxy can have a relatively straight sidewall, it will be appreciated that in some example embodiments, the underfill epoxy may have a fillet with a curved sidewall.

As mentioned, the dielectric redistribution layers 102 can be made with a coreless process, for example, using a temporary structure (not shown in FIG. 1, but see, e.g., FIG. 6 and related description). A dielectric layer 116 can further be laminated onto the dielectric redistribution layers 102. The dielectric layer 116 can further include an antenna ground layer 117 and can further include a first antenna element 118 and a first via 120. Such vias (and/or trenches) may be patterned in the dielectric layer 116 using any suitable mechanism, including photolithography, plasma etch, laser ablation, wet etch, combinations thereof, or the like. The vias and trenches may be defined by vertical and horizontal metal traces, respectively, within the dielectric layer 116. The vias and trenches may be filled with metal, such as by electroless metal plating, electrolytic metal plating, physical vapor deposition, combinations thereof, or the like. Excess metal may be removed by any suitable mechanism, such as etch, clean, polish, and/or chemical mechanical polish (CMP), combinations thereof, or the like. The antenna element 118 can include a patch antenna, a spiral antenna, or any other kind of antenna. In various embodiments, the antenna ground layer 117 may additionally comprise a signal which can be applied to the one or more of the antenna elements 118 (and 127, see below), for example, through the via 120. In other embodiments, different signal coupling mechanisms, for example, aperture coupling and/or resonant cavity coupling (not shown), can be used instead of a direct feed using the via 120. In various embodiments, the antenna element 118 (and 127, see below) may implement a phased array using the one or more antenna elements. In various embodiments, the phased array can include an array of antennas in which the relative phases of the respective signals feeding the antennas are set in such a way that the effective radiation pattern of the array is reinforced in a desired direction and suppressed in undesired directions. In another embodiment, the phased array elements can transmit amplification with phase shift in each antenna element or group of elements.

In various embodiments, the total thickness of the dielectric layer 116 can be approximately 5 microns to approximately 10,000 microns thick, with an example thickness of 100 microns. This can, for example, be designed for applications at a frequency of 60 GHz. The total thickness of the dielectric stack 116 can also be other thicknesses for antennas of other frequencies. Further, the dielectric layer 116 can comprise one or more constituent dielectric layers (not shown). The layer thickness of each of these constituent dielectric layers can be approximately 5 microns to approximately 10,000 microns thick, with an example thickness of 100 microns. The dielectric layer 116 can comprise an organic material or polymer material, a prepreg material, a ceramic, a glass, silicone, or any other kind of suitable material. In one embodiment, the dielectric layer 116 can be laminated onto the dielectric redistribution layers 102 as mentioned. Alternatively or additionally, the dielectric layer 116 can be deposited by any suitable technique, such as various deposition techniques, including, but not limited to, physical vapor deposition, chemical vapor deposition, and/or any other type of deposition technique. In various embodiments, a second dielectric layer 125 can be laminated or deposited on top of the first dielectric layer 116 and the antenna element 118. The second dielectric layer 125 can have any suitable thickness, from approximately 5 microns to approximately 10,000 microns thick, with an example thickness of 100 microns. This can, for example, be designed for applications at a frequency of 60 GHz. Further, the dielectric layer 125 can comprise one or more constituent dielectric layers (not shown). The layer thickness of each of these constituent dielectric layers can be approximately 5 microns to approximately 10,000 microns thick, with an example thickness of 100 microns. The second dielectric layer 125 can comprise any suitable material including, but not limited to, any type of oxide, for example, silicon dioxide or any other oxide. In other embodiments, the dielectric layer 125 can comprise an organic material or polymer material, a prepreg material, a ceramic, a glass, silicone, or any other kind of suitable material.

In various embodiments, the antenna package (e.g., the asymmetric millimeter-wave package) 100 can further include a second antenna element 127. The second antenna element 127 can include a metal layer which can be plated on top of the dielectric layer 125. Additionally or alternatively, the antenna element 127 can be laminated onto the second dielectric layer 125. The second antenna element 127 can include a metal layer comprising a patch antenna, a spiral antenna, or any other kind of antenna. In various embodiments, aperture coupling and/or resonant cavities may be used in place of a feed via 120.

In various embodiments, the antenna package (e.g., the asymmetric millimeter-wave package) 100 can further include a solder mask layer 130 that can be laminated onto the second antenna element 127 and/or the second dielectric layer 125. The solder mask layer 130 can include a prepreg material, a BET material, an Ajinomoto build-up film (ABF) material, an aluminum composite panel (ACP) material, and/or any other suitable material. Furthermore, the solder mask layer 130 can alternatively comprise a build of dielectric layer. In one embodiment, the solder mask layer 130 can serve as a protective layer which can reduce the exposure of the second antenna element 127 to environmental effects such as oxygen and/or water vapor in order to reduce the oxidation of the one or more underlying layers. Furthermore, the solder mask layer 130 can comprise a peel-off layer that can reduce the lost tangent at higher frequencies.

Various metal layers described in connection with the diagram of the antenna package can include but not be limited to aluminum, silver, copper and the like, and/or an alloy of aluminum, silver, copper, combinations thereof, or the like.

In various embodiments, various layers described in connection with the diagram of the antenna package can include but not be limited to a metallic, semi-metallic, or intermetallic material. In various embodiments, the layers can comprise a metallic material. Non-limiting examples include gold, copper, silver, aluminum, zinc, tin, platinum, and any of the like. Metallic materials may also be any alloys of such materials.

In various embodiments, the layers can comprise a semi-metallic material. Non-limiting examples include arsenic, antimony, bismuth, α-tin (gray tin) and graphite, and mercury telluride (HgTe). Semi-metallic materials may also be any mixtures of such materials.

In various embodiments, the layers can comprise an intermetallic material. Non-limiting examples include gold and aluminum intermetallics, copper and tin intermetallics, tin and nickel intermetallics, tin and silver intermetallics, tin and zinc intermetallics, and any of the like. Intermetallic materials may also be any alloys of such materials.

The layers described in connection with the diagram of the antenna package can be deposited via sputtering, paste printing, squeegee, atomic layer deposition (ALD), or a variety of different physical vapor deposition (PVD) techniques. The layers may be laminated by any suitable process, including, for example, cold roll or hot roll. In example embodiments, the layer may be hot pressed at a predetermined temperature and pressure. Additionally, the layer can be deposited via any of the above mentioned techniques (or others that are not explicitly named herein) and then picked and placed or laminated thereon, or positioned via any other technique.

The forming of the interconnects comprising the metal layers (optionally having a plurality of pads) 106 can further include electrolytic plating metal layers (optionally having a plurality of pads) 106 in the various dielectric buildup layers. In one embodiment, the electroplating can use electrodeposition, for example, using electric current to reduce dissolved metal cations so that they form a coherent metal coating in contact with the metal layers.

In order to fabricate the various build-up and metal layers described herein, various fabrication steps can be performed, including steps to laminate the layers, expose the laminated layers to radiation, develop layers, cure the layers, plate the pads into layers, and pattern the layers with the pads embedded therein. In one embodiment, processing the layers can further include exposing the layers using a mask. The mask can include, for example, a photomask, which can refer to an opaque plate with holes or transparencies that allow light to shine through in a defined pattern. In one embodiment, the photomask can include transparent fused silica blanks covered with a pattern defined with a chrome metal-absorbing film. In another embodiment, the photomask can be used at a predetermined wavelength, including, but not limited to, approximately 436 nm, approximately 365 nm, approximately 248 nm, and approximately 193 nm.

In one embodiment, there can be a one-to-one correspondence between the mask pattern and the layer pattern, for example, using one-to-one mask aligners. In other embodiments, steppers and scanners with reduction optics can be used to project and shrink the pattern by four or five times onto the surface of the layers. To achieve complete coverage, the photoimageable dielectric layer is repeatedly "stepped" from position to position under the optical column until full exposure is achieved.

In one embodiment, processing the layers can further include developing the layers using an ultraviolet light source. In one embodiment, the light types that can be used to image the layers can include but not be limited to UV and DUV (Deep UV) with the g and I lines having wavelength of approximately 436 nm and approximately 365 nm, respectively, of a mercury-vapor lamp. In various embodiments, the development of the layers can include an exposure to the ultraviolet light source for a few seconds through the mask. The areas of the layers which are exposed stay, and the rest of the layers are developed.

In one embodiment, the developing light wavelength parameter can be related to the thickness of the layers with thinner layers corresponding to shorter wavelengths. This can permit a reduced aspect ratio and a reduced minimum feature size.

In one embodiment, various chemicals may be used for permanently giving the layers the desired property variations. The chemicals can include but not be limited to poly(methyl methacrylate) (PMMA), poly(methyl glutarimide) (PMGI), phenol formaldehyde resin (DNQ/Novolac), and SU-8. In one embodiment, chemicals can be applied as a liquid and, generally, spin-coated to ensure uniformity of thickness.

In one embodiment, processing the layers further comprises curing the layers using a heat source. The heat source can generate heat of a predetermined temperature of approximately 120° C. to approximately 140° C. in approximately 45 minutes. In one embodiment, the heat source can comprise an oven. The oven can have a temperature uniformity of approximately ±0.5% of the predetermined temperature. Moreover, the oven can comprise low particulate environmental controls to protect contamination, for example, using HEPA filtration of the air inside the oven. In one embodiment, the HEPA filter use can produce Class 10 (ISO Class 4) air quality. Moreover, the oven can be configured to have low oxygen levels to prevent oxidation of any of the layers.

Figure 2:
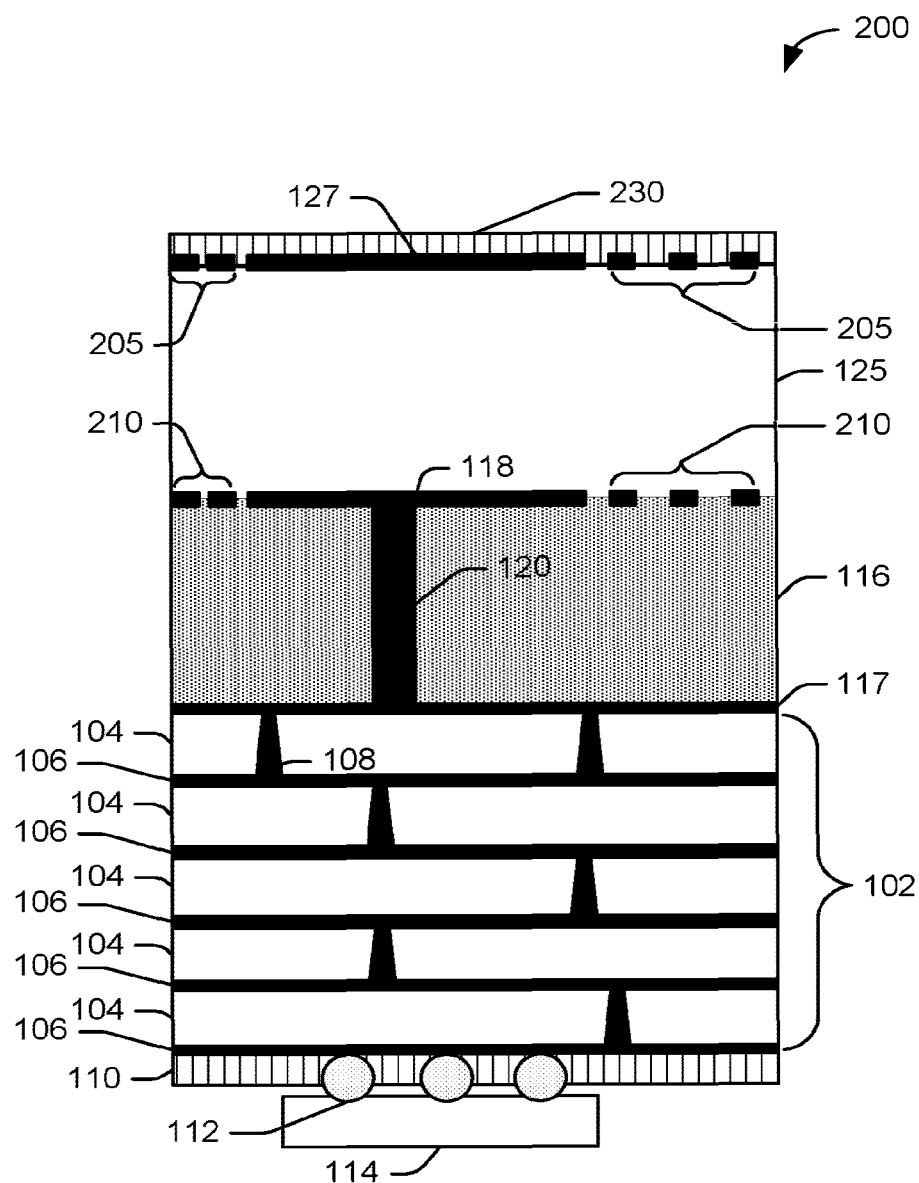
FIG. 2 shows a simplified diagram of an example cross-sectional view of a semiconductor package (e.g., a millimeter (mm)-wave antenna package) with dummification elements in accordance with example embodiments of the systems and methods disclosed herein.

FIG. 2 shows another example diagram of a cross-sectional view of the antenna package (e.g., the millimeter-wave antenna package) 200 in accordance with various embodiments of the disclosure. FIG. 2 may include, but not be limited to, similar elements as that shown in FIG. 1, but may also further include dummification elements 205 and 210. In one embodiment, the dummification elements 205 and 210 can be included in the same layer as one or both of the antenna patch layers 118 and 127. The dummification elements 205 and 210 can be included to improve the electrical performance and/or the substrate planarity of the asymmetric millimeter-wave package 200, as discussed with reference to FIG. 5. In various embodiments, the dummification elements can include metal, semimetal, or intermetallic materials. Further, FIG. 2 additionally shows an example embodiment where the solder mask layer 130 of FIG. 1 has been replaced by a build-up (BU) layer 230. As mentioned in FIG. 1, the BU-layer 230 can allow for the prevention of oxidation of the antenna elements and the various other metal layers in the antenna package (e.g., the millimeter-wave antenna package) 200. In another embodiment, the dummification elements 205 and 210 can reduce image current and thereby increasing the gain and/or efficiency of the antenna in the antenna package (e.g., the millimeter-wave antenna package) 200. Furthermore, the dummification elements 205 and 210 can provide mechanical robustness to the antenna package (e.g., the millimeter-wave antenna package) 200. In particular, the dummification elements 205 and 210 can reduce the package warpage. In another embodiment, the dummification elements 205 and 210 can also be used around one or more transmission lines (not shown). The transmission lines can be used in the antenna package (e.g., the millimeter-wave antenna package) 200 in order to route the signals between the dies 114 and the antenna elements 118 and 127. This can enhance the isolation between feed lines used in phased array applications associated with the millimeter-wave antenna package 200. In various embodiments, the dummification elements 205 and 210 can reduce surface currents that oppose the current of the antenna, which can increase the efficiency of the antenna.

In various embodiments, the longest dimension of width or length of the dummification elements 205 and 210 can be approximately the wavelength associated with the operational frequency of the antenna elements divided by a predetermined constant, for example, 10. In various embodiments, the shape of the dummification elements and/or the antenna elements can be any suitable shape including but not limited to, a square shape, a triangle shape, a polygonal shape, a circular shape, and any other kind of shape. In various embodiments, the metal density of the dummification elements 205 and 210 can be maximized, for example, by choosing a predetermined packing structure.

In various embodiments, the dummification elements can comprise floating metal dummy patches. Further, a predetermined minimum distance can be maintained between the dummy patches and the antenna elements to reduce potential antenna loading. In addition, the dummy patches may be sized and arranged in such a way that the dielectric surrounding the patch antenna can behave as a high impedance medium or as a reflector for in-substrate radiation.

Various layers (including but not limited to the dummification elements) described in connection with the diagram of the antenna package can include but not be limited to aluminum, silver, copper and the like, and/or an alloy of aluminum, silver, copper, combinations thereof, or the like.

In various embodiments, various layers described in connection with the diagram of the antenna package can include but not be limited to, a metallic, semi-metallic, or intermetallic material. In various embodiments, the layers can comprise a metallic material. Non-limiting examples include gold, copper, silver, aluminum, zinc, tin, platinum, and any of the like. Metallic materials may also be any alloys of such materials.

In various embodiments, the layers can comprise a semimetallic material. Non-limiting examples include arsenic, antimony, bismuth, α-tin (gray tin) and graphite, and mercury telluride (HgTe). Semi-metallic materials may also be any mixtures of such materials.

In various embodiments, the layers can comprise an intermetallic material. Non-limiting examples include gold and aluminum intermetallics, copper and tin intermetallics, tin and nickel intermetallics, tin and silver intermetallics, tin and zinc intermetallics, and any of the like. Intermetallic materials may also be any alloys of such materials.

The layers described in connection with the diagram of the antenna package can be deposited via sputtering, paste printing, squeegee, atomic layer deposition (ALD), or a variety of different physical vapor deposition (PVD) techniques. The layers may be laminated by any suitable process, including, for example, cold roll or hot roll. In example embodiments, the layer may be hot pressed at a predetermined temperature and pressure. Additionally the layer can be deposited via any of the above mentioned techniques (or others that are not explicitly named herein) and then picked and placed, or laminated thereon, or positioned via any other technique.

The forming of the interconnects further comprising metal layers (optionally having a plurality of pads) 106 can further include electrolytic plating metal layers (optionally having a plurality of pads) 106 in the various dielectric buildup layers. In one embodiment, the electroplating can use electrodeposition, for example, using electric current to reduce dissolved metal cations so that they form a coherent metal coating in contact with the metal layers.

In order to fabricate the various build-up and metal layers described herein, various fabrication steps can be performed, including steps to laminate the layers, expose the laminated layers to radiation, develop layers, cure the layers, plate the pads into layers, and pattern the layers with the pads embedded therein. In one embodiment, processing the layers can further include exposing the layers using a mask. The mask can include, for example, a photomask, which can refer to an opaque plate with holes or transparencies that allow light to shine through in a defined pattern. In one embodiment, the photomask can include transparent fused silica blanks covered with a pattern defined with a chrome metal-absorbing film. In another embodiment, the photomask can be used at a predetermined wavelength, including but not limited to, approximately 436 nm, approximately 365 nm, approximately 248 nm, and approximately 193 nm. In one embodiment, there can be a one-to-one correspondence between the mask pattern and the layer pattern, for example, using one-to-one mask aligners. In other embodiments, steppers and scanners with reduction optics can be used to project and shrink the pattern by four or five times onto the surface of the layers. To achieve complete coverage, the photoimageable dielectric layer is repeatedly "stepped" from position to position under the optical column until full exposure is achieved.

In one embodiment, processing the layers can further include developing the layers using an ultraviolet light source. In one embodiment, the light types that can be used to image the layers can include but not be limited to UV and DUV (Deep UV) with the g and I lines having wavelength of approximately 436 nm and approximately 365 nm, respectively, of a mercury-vapor lamp. In various embodiments, the development of the layers can include an exposure to the ultraviolet light source for a few seconds through the mask. The areas of the layers which are exposed stay, and the rest of the layers are developed.

In one embodiment, the developing light wavelength parameter can be related to the thickness of the layers, with thinner layers corresponding to shorter wavelengths. This can permit a reduced aspect ratio and a reduced minimum feature size.

In one embodiment, various chemicals may be used for permanently giving the layers the desired property variations. The chemicals can include but not be limited to poly(methyl methacrylate) (PMMA), poly(methyl glutarimide) (PMGI), phenol formaldehyde resin (DNQ/Novolac), and SU-8. In one embodiment, chemicals can be applied as a liquid and, generally, spin-coated to ensure uniformity of thickness.

In one embodiment, processing the layers further comprises curing the layers using a heat source. The heat source can generate heat of a predetermined temperature of approximately 120° C. to approximately 140° C. in approximately 45 minutes. In one embodiment, the heat source can comprise an oven. The oven can have a temperature uniformity of approximately ±0.5% of the predetermined temperature. Moreover, the oven can comprise low particulate environmental controls to protect contamination, for example, using HEPA filtration of the air inside the oven. In one embodiment, the HEPA filter use can produce Class 10 (ISO Class 4) air quality. Moreover, the oven can be configured to have low oxygen levels to prevent oxidation of any of the layers.

Figure 3:
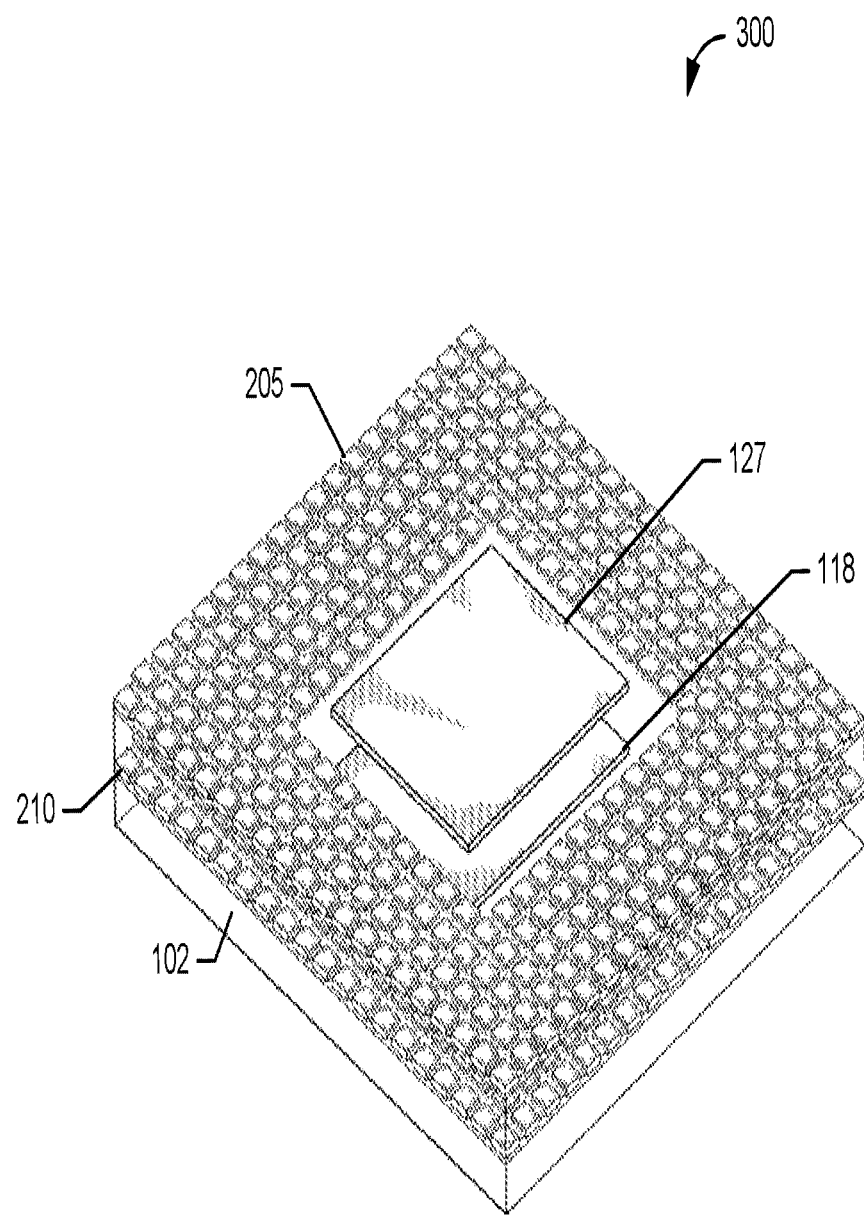
FIG. 3 shows an example simplified three-dimensional view of a semiconductor package (e.g., a millimeter (mm)-wave antenna package) with an antenna in addition to the dummification elements in accordance with example embodiments of the systems and methods disclosed herein.

FIG. 3 shows an example three-dimensional diagram 300 of the antenna package (e.g., the millimeter-wave antenna package) with the dummification elements 205 and 210, in accordance with example embodiments of the systems and methods disclosed herein. Furthermore, as can be seen in FIG. 3, the dummification elements 205 and 210 can be included in the same layers as the antenna elements 118 and 127. In one embodiment, the dummification elements 205 and 210 can serve to improve the electrical performance and substrate planarity.

As mentioned, the dummification elements 205 and 210 can provide mechanical robustness to the antenna package (e.g., the millimeter-wave antenna package) 300. In particular, the dummification elements 205 and 210 can reduce the package warpage. In another embodiment, the dummification elements 205 and 210 can also be used around one or more transmission lines (not shown). The transmission lines can be used in the antenna package (e.g., the millimeter-wave antenna package) 300 in order to route the signals between a die and the antenna elements 118 and 127. This can enhance the isolation between feed lines used in a phased array applications associated with the millimeter-wave antenna package 300. In various embodiments, the dummification elements 205 and 210 can conduct surface currents that oppose the current of the antenna, which can increase the efficiency of the antenna.

In various embodiments, the longest dimension of width or length of the dummification elements 205 and 210 can be approximately the wavelength associated with the operational frequency of the antenna elements divided by a predetermined constant, for example, 10. In various embodiments, the shape of the dummification elements and/or the antenna elements can be any suitable shape including, but not limited to, a square shape, a triangle shape, a polygonal shape, a circular shape, and any other kind of shape. In various embodiments, the metal density of the dummification elements 205 and 210 can be maximized, for example, by choosing a predetermined packing structure.

In various embodiments, the dummification elements can comprise floating metal dummy patches. Further, a predetermined minimum distance can be maintained between the dummy patches and the antenna elements to reduce potential antenna loading. In addition, the dummy patches may be sized and arranged in such a way that the dielectric surrounding the patch antenna can behave as a high impedance medium or as a reflector for in-substrate radiation.

Figure 4:
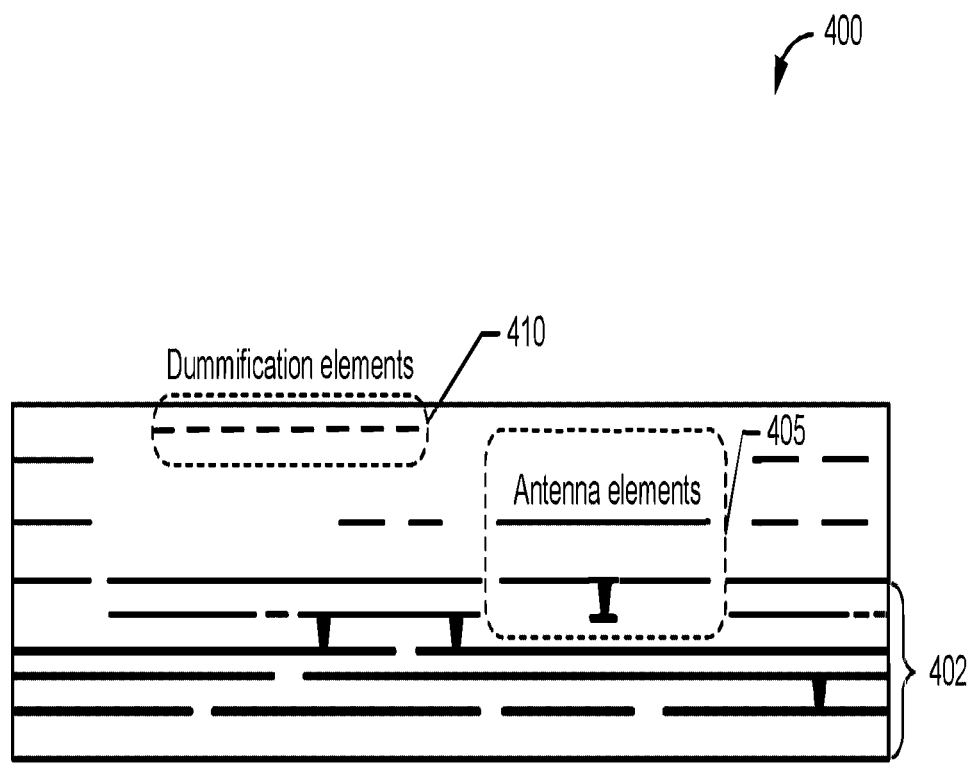
FIG. 4 shows a simplified diagram of an example cross-sectional view of the fabricated semiconductor package (e.g., a millimeter (mm)-wave antenna package) with dummification elements in accordance with example embodiments of the systems and methods disclosed herein.

FIG. 4 shows a diagram of an example cross-sectional representation of a fabricated a semiconductor package (e.g., a millimeter (mm)-wave antenna package) 400 with dummification elements 410, antenna elements 405, and redistribution layers 402, in accordance with example embodiments of the systems and methods disclosed herein.

Figure 5:
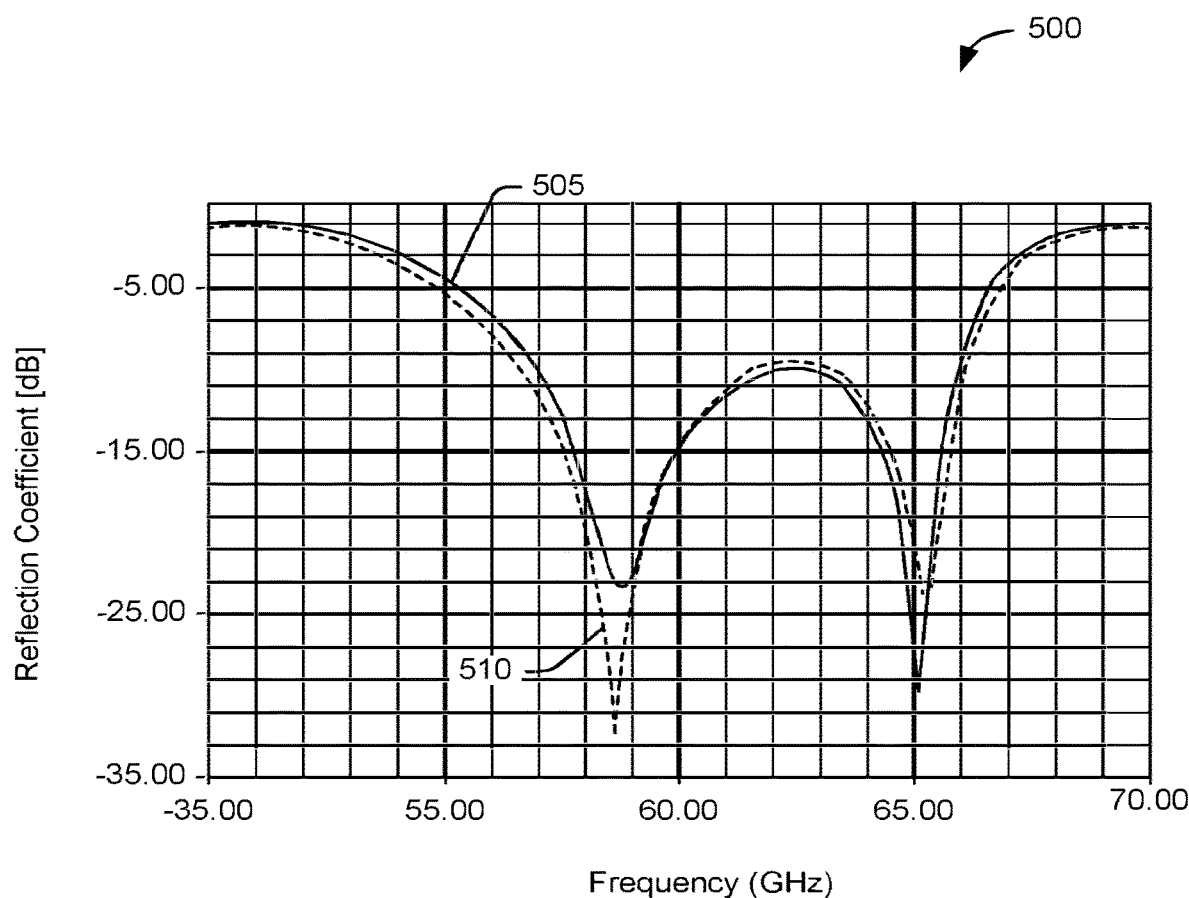
FIG. 5 shows a simplified diagram of a view of the electrical performance (antenna bandwidth and gain) of a single element antenna in a semiconductor package (e.g., a millimeter (mm)-wave antenna package) in accordance with example embodiments of the systems and methods disclosed herein.

FIG. 5 shows an example diagram 500 of the performance of the disclosed package antenna (e.g., the antenna millimeter-wave package), in accordance with example embodiments of the systems and methods disclosed herein. In particular, FIG. 5 shows a graph of the reflection coefficient in decibels (dB) versus the frequency of device operation (in GHz) for the package antenna with (curve 510) and without (curve 505) the dummification elements (see, for example, FIG. 2, elements 205 and 210 and related description and/or FIG. 3 elements 205 and 210 and related description). The figure shows that for a test frequency of approximately 60 GHz and an approximately 100 microsecond response time, the inclusion of the dummification elements (curve 510) does not deteriorate the electrical performance (e.g., the antenna bandwidth and gain) of the antennas (e.g., single element antennas) of the antenna package. Further, as can be seen in FIG. 5, the reflection coefficient is reduced at the resonant frequencies of approximately 58.5 GHz and approximately 65-66 GHz, in the case of the package antenna having the dummification elements (curve 510), more than the package antenna without the dummification elements (curve 505), but the overall 10 dB bandwidth remains almost unchanged.

FIGS. 6A-6F shows diagrams of example steps in the fabrication of the antenna millimeter-wave package, in accordance with one or more embodiments of the disclosure.

The process, as depicted herein, may be implemented to concurrently or nearly concurrently fabricate a plurality of antenna packages. The antenna package may be fabricated with any variety of processes or sequences thereof. Although a particular fabrication sequence is shown here with fabrication of various structures and/or features both final and/or temporary, any variations for fabricating similar features may be implemented in accordance with example embodiments of the disclosure. Further still, there may be additional and/or fewer features than the features disclosed herein for the fabrication of the antenna substrates, in accordance with example embodiments of the disclosure. Additionally, although an example embodiment of the sequence of processes for fabrication is depicted, it will be appreciated that there may be any number of antenna packages that may be processed concurrently and/or near concurrently through any of the processes depicted herein. For example, some processes may be batch processes where a particular unit may be processed along with another of that unit. In other cases, unit processes may be performed in a sequential manner on work-in-progress (WIP).

Figure 6A:
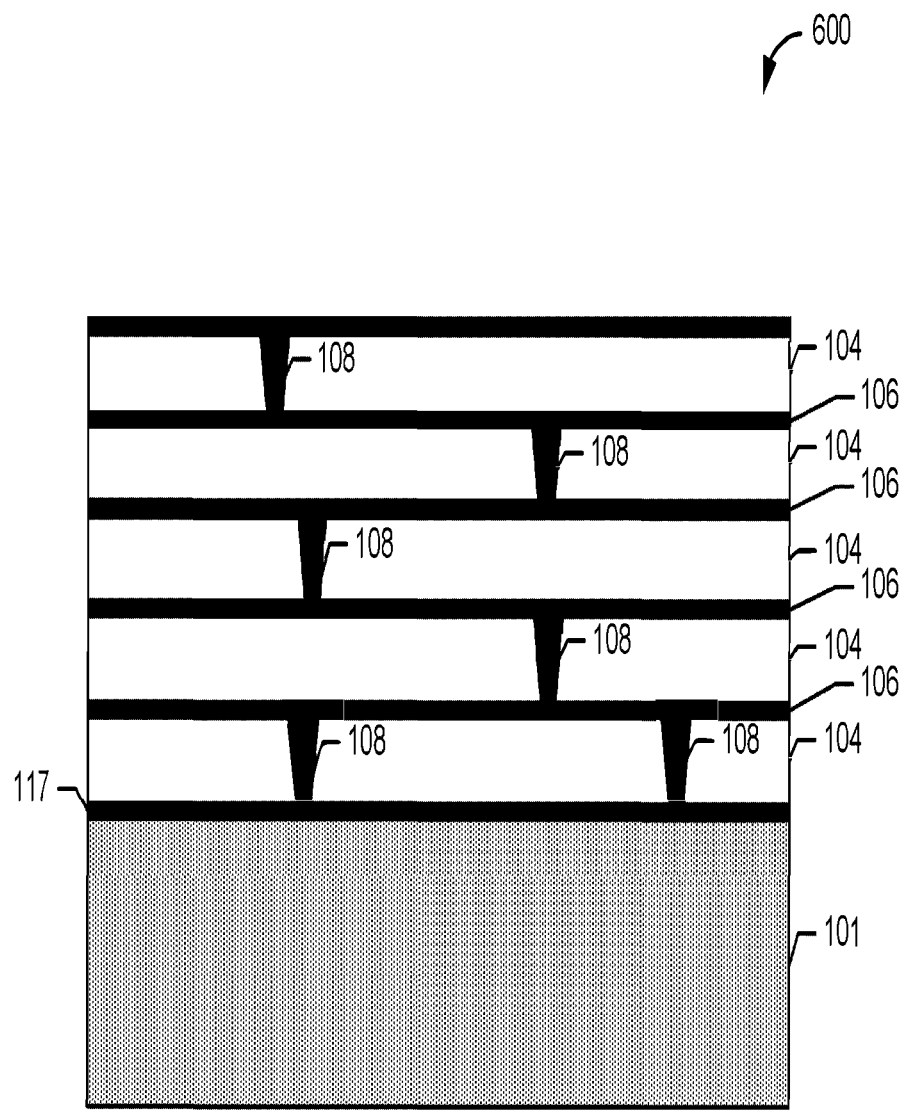
FIGS. 6A, 6B, 6C, 6D, 6E, and 6F show simplified diagrams of an operation flow for the fabrication of an example of a semiconductor package (e.g., a millimeter (mm)-wave antenna package) with dummification elements in accordance with example embodiments of the systems and methods disclosed herein.

In particular, FIG. 6A shows a diagram 600 of the first step in the fabrication of the antenna package (e.g., the millimeter-wave antenna package). The diagram 600 shows a temporary substrate 101 (alternatively referred to as a core and/or a temporary core herein); on this temporary substrate, a dielectric redistribution layer 102 can be fabricated. The temporary substrate 101 can comprise a sacrificial material that can ultimately be discarded at the end of the process.

The dielectric redistribution layer 102 can be laminated layer by layer onto the temporary substrate 101, starting with a first layer 117 that can correspond to the antenna ground/signaling layer 117 of FIG. 1. In addition, the plurality of dielectric layers 104 and metal layers (optionally having a plurality of pads) 106 comprising the dielectric redistribution layer 102 can be laminated and/or deposited in any way, including but not limited to, plating the layers in sequence. Furthermore, the one or more metal layers (optionally having a plurality of pads) 106 can also be laminated into the structure of the dielectric redistribution layer 102, for example, during the lamination of the plurality of dielectric layers 104 and metal layers 106.

As mentioned, the dielectric redistribution layer 102 can include a plurality of dielectric layers 104, a plurality of metal layers (optionally having a plurality of pads) 106, and a plurality of vias 108. The dielectric layers 104 can comprise any suitable dielectric material including, for example, silicon dioxide or any other known oxide. The dielectric layers 104 can further comprise an organic material or polymer material, a prepreg material, a ceramic, a glass, silicone, or any other kind of suitable material. Further, in various aspects, the dielectric materials can comprise a polymer material, ceramic material, plastics, composite materials, liquid crystal polymer (LCP), epoxy laminates of fiberglass sheets, prepreg, FR-4 materials, FR-5 materials, combinations thereof, or the like. The metal layers (optionally having a plurality of pads) 106 can include copper, silver, or any other suitable metal. The number of layers in the dielectric layers 104 and metal layers (optionally having a plurality of pads) 106 comprising the dielectric redistribution layer 102 can be any suitable number and may, in various embodiments, depend on the number of connections to be made by the dielectric redistribution layers 102 and one or more external connections (for example, to power supplies, off-board integrated circuits, and/or memory, and the like).

Figure 6B:
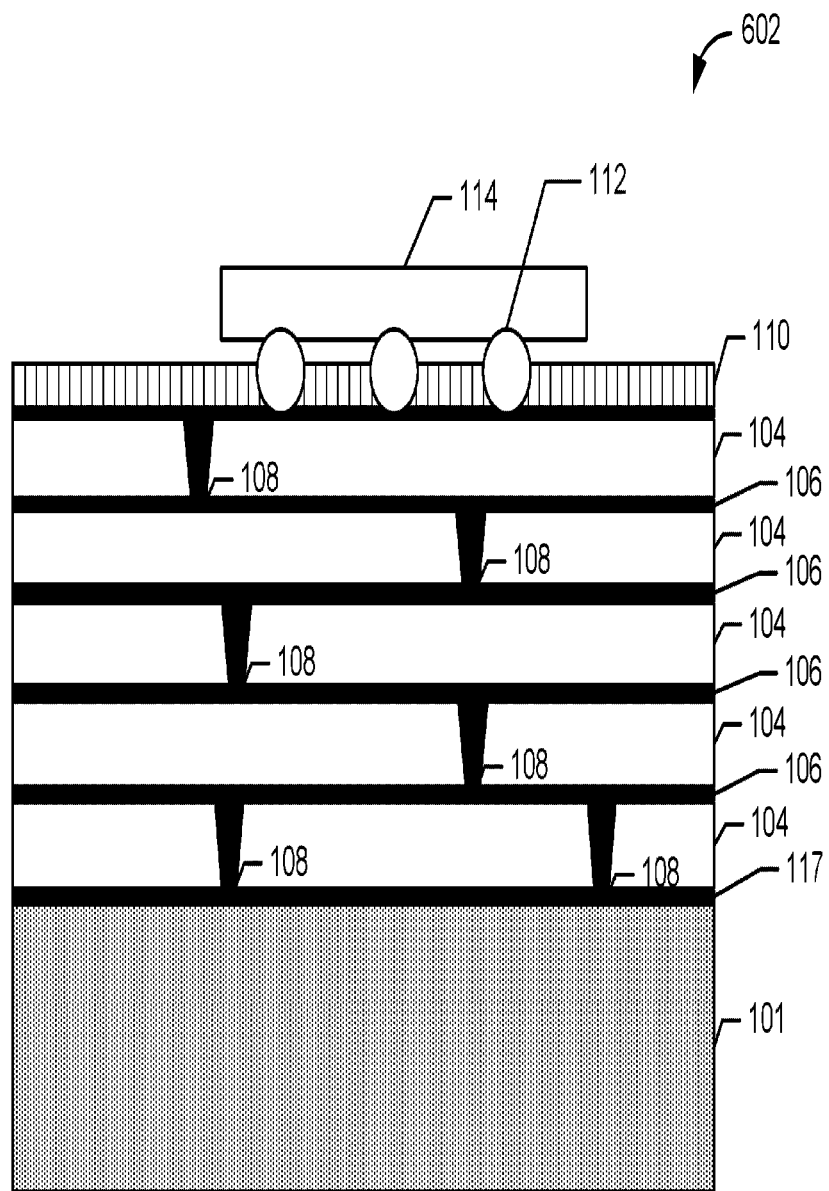

FIG. 6B shows another diagram 602 in the process flow for the fabrication of the antenna package (e.g., the millimeter-wave antenna package), in accordance with various embodiments of the disclosure. FIG. 6B shows a diagram in which an interface layer 110 can be formed on top of the dielectric redistribution layers 102, and the interface layer 110 can include a ball grade array (BGA) 112 that can be connected to a die 114. The interface layer 110, the BGA 112, and the die 114 can be formed on the dielectric redistribution layers 102 by any suitable method, including but not limited to, lamination and/or physical deposition.

The antenna package (e.g., the millimeter-wave antenna package) 600 can further comprise an interface layer 110 that can alternatively be referred to as a solder mask layer and/or a buildup layer. The interface layer 110 may include a dielectric material or any other suitable material, including but not limited to, any suitable dielectric material including, for example, silicon dioxide or any other known oxide. The dielectric layers 104 can further comprise an organic material or polymer material, a prepreg material, a ceramic, a glass, silicone, or any other kind of suitable material.

The antenna package (e.g., the millimeter-wave antenna package) 602 can further include a ball grade array (BGA) 112, and the BGA 112 can connect to one or more dies 114. The BGA 112 can include copper, silver, or any other metal, inter-metallic, or hybrid material. The dies 114 can include one or more electronic components, including at least one integrated circuit die. The die may be electrically and mechanically coupled to the interface layer 110 via any suitable mechanism, such as metal pillars (e.g., copper pillars), flip chip bumps, solder bumps, any type of low-lead or lead-free solder bumps, tin-copper bumps, wire bonds, wedge bonds, controlled collapse chip connect (C4), anisotropic conductive film (ACF), nonconductive film (NCF), combinations thereof, copper pillar or the like. In some example embodiments, the dies 114 (e.g., integrated circuits), as described herein, may have input/output (I/O) connections for various sizes. Further, the BGA 112 connections can alternatively or additionally be land grid array (LGA), other area connections, periphery connections, or the like. In addition, or alternatively, in example embodiments, the semiconductor component including the dies 114, the dielectric redistribution layer 102, and/or the BGA 112 may have a connector disposed thereon, such as an AFL connector for making connections to cables. The semiconductor component may also be pre-packaged as a wafer level chip scale package (WL-CSP), embedded wafer level ball grid array (e-WLB), or flip chip-chip scale package (FC-CSP).

The dies 114 can include any suitable Integrated Circuit (IC), System On A Chip (SoC), or any other electronic device. The interface layer 110 can, in various embodiments, be positioned between the dielectric redistribution layer 102 and the dies 114. The dies 114 can include electronic components, which may be any suitable electronic components, including but not limited to, integrated circuits, surface mount devices, active devices, passive devices, diodes, transistors, connectors, resistors, inductors, capacitors, microelectromechanical systems (MEMSs), combinations thereof, or the like.

In one embodiment, one or more electronic components, including at least one integrated circuit die, may be electrically and mechanically coupled to the interface layer 110, such as metal pillars (e.g., copper pillars), flip chip bumps, solder bumps, any type of low-lead or lead-free solder bumps, tin-copper bumps, wire bonds, wedge bonds, controlled collapse chip connects (C4), anisotropic conductive film (ACF), nonconductive film (NCF), combinations thereof, or the like.

Figure 6C:
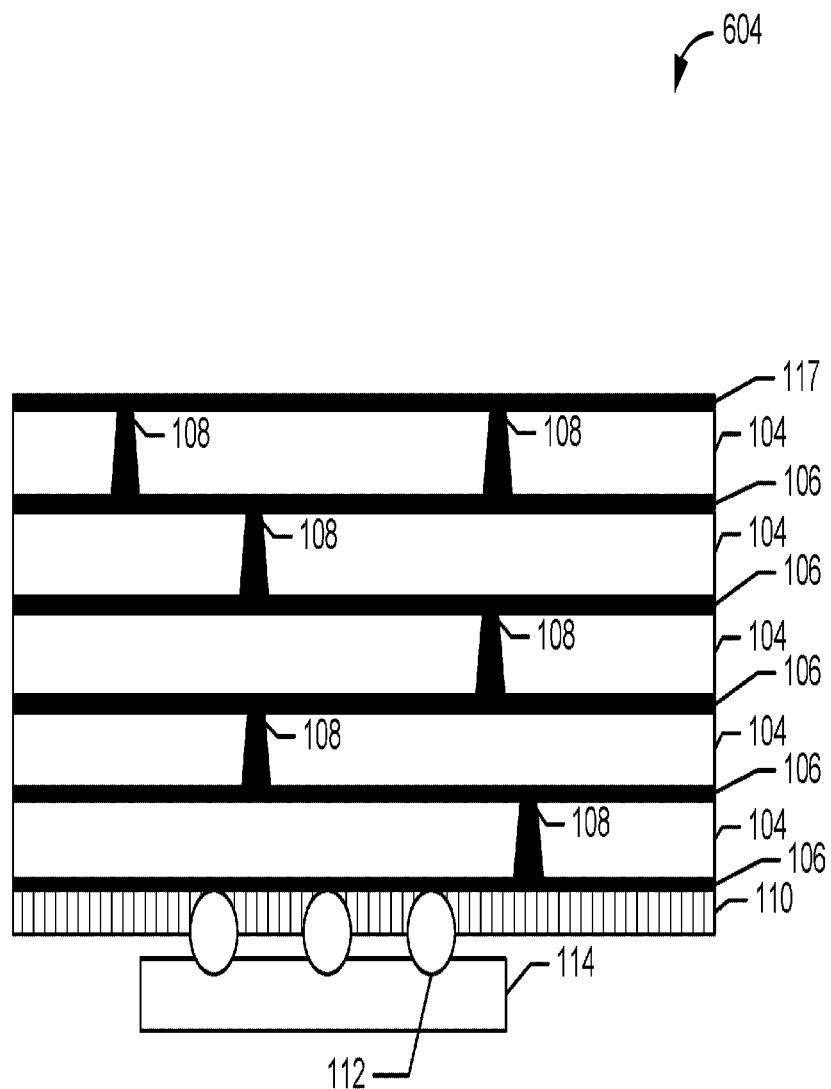

FIG. 6C shows a diagram 604 in the process flow for the fabrication of the antenna package (e.g., the millimeter-wave antenna package), in accordance with various embodiments of the disclosure. FIG. 6C shows a diagram in which the temporary substrate 101 can be removed from the first structure comprising the dielectric redistribution layer 102 with the dies 114, the BGA 112, and the interface layer 110 producing a standalone structure.

In one embodiment, removing the temporary substrate 101 can further include stripping the temporary substrate 101 from the first structure. Removing the temporary substrate 101 can use a liquid resist stripper, which chemically alters the resist so that it no longer adheres to the underlying layers. The resist stripper can comprise organic materials specifically formulated to remove temporary substrate 101. In one embodiment, the resist stripper can comprise a resist stripping solution composition of pH approximately 5 to pH approximately 8 containing a salt of acid with a base free from metal ions, a water-soluble organic solvent, and water, optionally together with a corrosion inhibitor.

In one embodiment, removing the temporary substrate 101 of FIG. 1C can further include etching the first structure. In another embodiment, the etching can include a flash etch. In one embodiment, the temporary substrate 101 can be etched with a piranha etch, including sulfuric acid and hydrogen peroxide.

In one embodiment, the removal of the temporary substrate 101 may be controlled approximately using the etching time and the known etch rate. In one embodiment, the etching entirely removes the temporary substrate 101 of the structure without damaging the underlying layers. This can be done in part based on the ratio of etch rates in the two materials (selectivity). In various embodiments, the etching can include an anisotropic etch that produces sharp, well-controlled features.

Figure 6D:
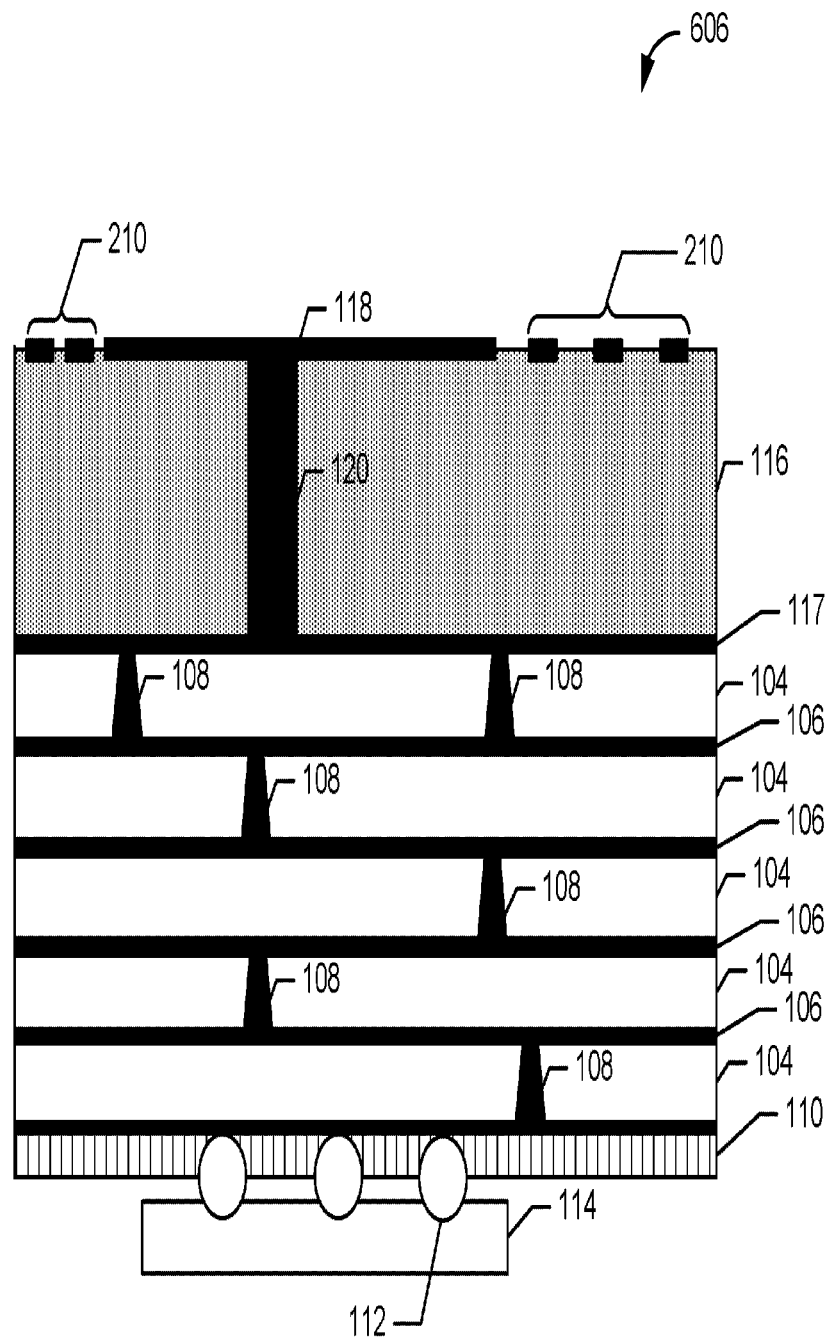

FIG. 6D shows a diagram 606 in the process flow for the fabrication of the antenna package (e.g., the millimeter-wave antenna package), in accordance with various embodiments of the disclosure. In particular, a dielectric layer 116 can be formed on the antenna ground layer 117. Additionally, a via 120 and an antenna element 118 can be formed. Furthermore, dummification elements 210 can be formed on top of the dielectric layer 116. The dielectric layer 116 can be approximately 100 micrometers in thickness at 60 GHz applications but can be any other suitable thickness, for example, in other applications at other frequencies. The antenna element 118 and the metal layers can be laminated onto the dielectric redistribution layers 102 or can be deposited in any suitable method.

Figure 6E:
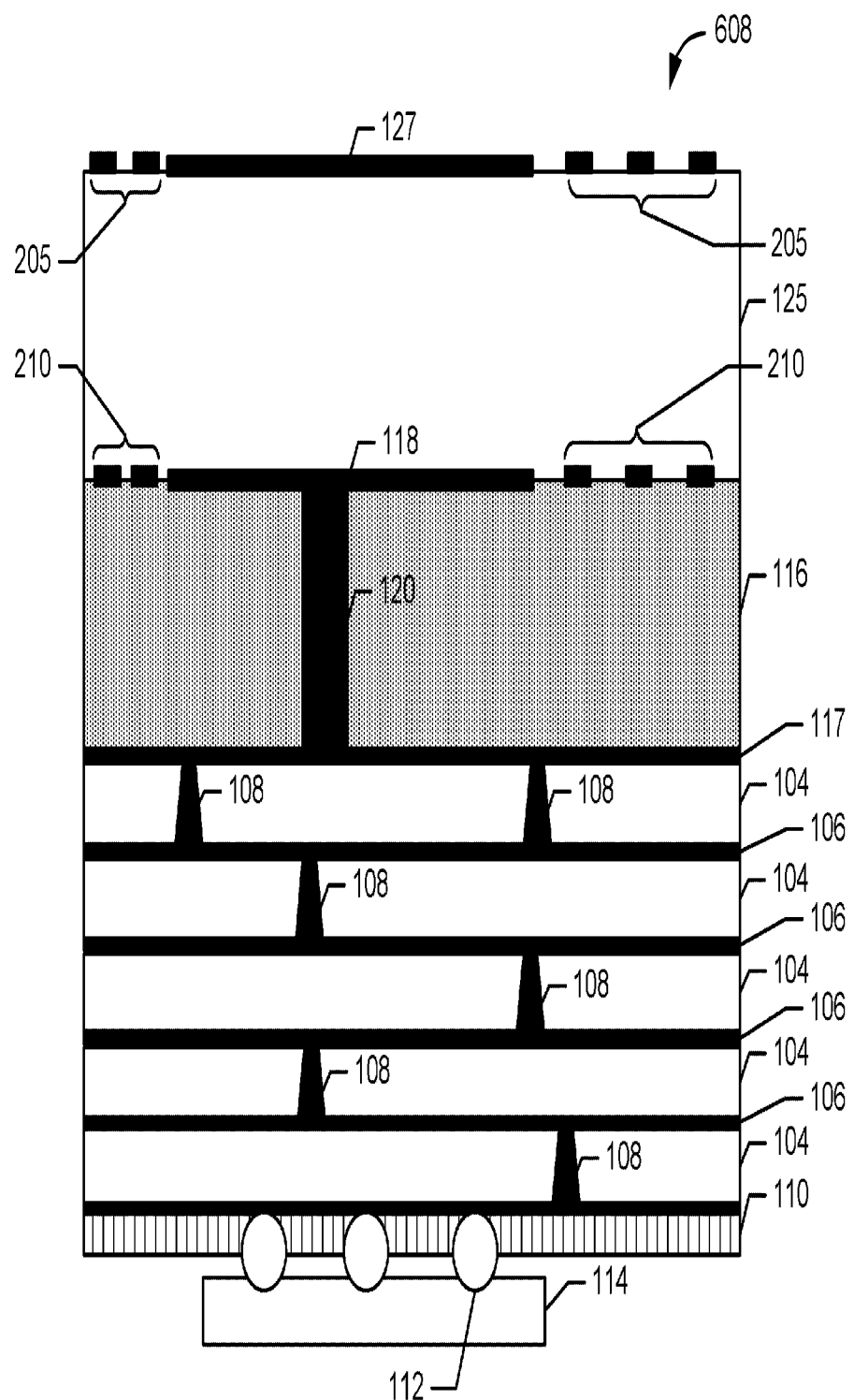

FIG. 6E shows a diagram 608 in the process flow for the fabrication of the antenna package (e.g., the millimeter-wave antenna package), in accordance with various embodiments of the disclosure. As shown, a second dielectric layer 125 can be laminated onto the antenna element 118 and the first dielectric layer 116 of FIG. 6D. Furthermore, a second antenna element 127 and other dummification elements 205 can be fabricated on top of the second dielectric layer 125. The thickness of the second dielectric layer 125 can be approximately 100 micrometers in thickness but can also be any other suitable thickness.

Figure 6F:
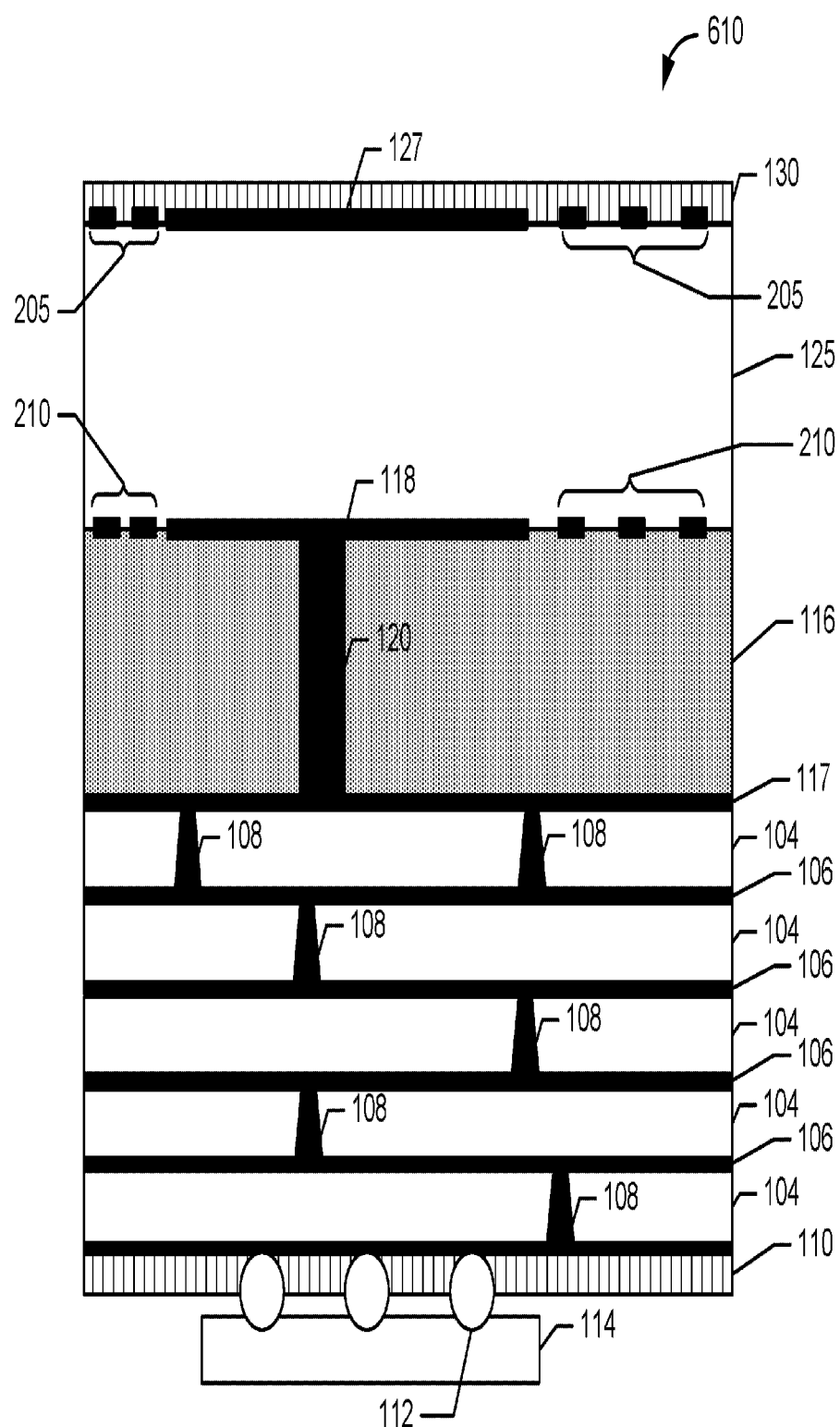

FIG. 6F shows a diagram 610 in the process flow for the fabrication of the antenna package (e.g., the millimeter-wave antenna package), in accordance with various embodiments of the disclosure. As shown, a solder mask layer 130 can be formed on top of the second antenna element 127 and/or the second dielectric layer 125. The solder mask layer 130 can be laminated on top of the second antenna element 127 and the second dielectric layer 125 or it can be deposited in any suitable method. In one embodiment, the lamination of a build up layer can replace the solder mask layer 130 and the build-up layer can be laminated. The lamination can be performed in a reducing environment, for example, in $NH_3$ and/or Argon based-environment.

Various layers (including but not limited to the dummification elements) described in connection with the diagram of the antenna package can include but not be limited to aluminum, silver, copper and the like, and/or an alloy of aluminum, silver, copper, combinations thereof, or the like.

In various embodiments, various layers described in connection with the diagram of the antenna package can include but not be limited to a metallic, semi-metallic, or intermetallic material. In various embodiments, the layers can comprise a metallic material. Non-limiting examples include gold, copper, silver, aluminum, zinc, tin, platinum, and any of the like. Metallic materials may also be any alloys of such materials.

In various embodiments, the layers can comprise a semi-metallic material. Non-limiting examples include arsenic, antimony, bismuth, α-tin (gray tin) and graphite, and mercury telluride (HgTe). Semi-metallic materials may also be any mixtures of such materials.

In various embodiments, the layers can comprise an intermetallic material. Non-limiting examples include gold and aluminum intermetallics, copper and tin intermetallics, tin and nickel intermetallics, tin and silver intermetallics, tin and zinc intermetallics, and any of the like. Intermetallic materials may also be any alloys of such materials.

The layers described in connection with the diagram of the antenna package can be deposited via sputtering, paste printing, squeegee, atomic layer deposition (ALD), or a variety of different physical vapor deposition (PVD) techniques. The layers may be laminated by any suitable process, including, for example, cold roll or hot roll. In example embodiments, the layer may be hot pressed at a predetermined temperature and pressure. Additionally the layer can be deposited via any of the above mentioned techniques (or others that are not explicitly named herein) and then picked and placed, laminated thereon, or positioned via any other technique.

The forming of the interconnects comprising metal layers (optionally having a plurality of pads) 106 can further include electrolytic plating metal layers (optionally having a plurality of pads) 106 in the various dielectric buildup layers. In one embodiment, the electroplating can use electrodeposition, for example, using electric current to reduce dissolved metal cations so that they form a coherent metal coating in contact with the metal layers.

In order to fabricate the various build-up and metal layers described herein, various fabrication steps can be performed, including steps to laminate the layers, expose the laminated layers to radiation, develop layers, cure the layers, plate the pads into layers, and pattern the layers with the pads embedded therein. In one embodiment, processing the layers can further include exposing the layers using a mask. The mask can include, for example, a photomask, which can refer to an opaque plate with holes or transparencies that allow light to shine through in a defined pattern. In one embodiment, the photomask can include transparent fused silica blanks covered with a pattern defined with a chrome metal-absorbing film. In another embodiment, the photomask can be used at a predetermined wavelength, including but not be limited to, approximately 436 nm, approximately 365 nm, approximately 248 nm, and approximately 193 nm. In one embodiment, there can be a one-to-one correspondence between the mask pattern and the layer pattern, for example, using one-to-one mask aligners. In other embodiments, steppers and scanners with reduction optics can be used to project and shrink the pattern by four or five times onto the surface of the layers. To achieve complete coverage, the photoimageable dielectric layer is repeatedly "stepped" from position to position under the optical column until full exposure is achieved.

In one embodiment, processing the layers can further include developing the layers using an ultraviolet light source. In one embodiment, the light types that can be used to image the layers can include but not be limited to UV and DUV (Deep UV) with the g and I lines having wavelength of approximately 436 nm and approximately 365 nm, respectively, of a mercury-vapor lamp. In various embodiments, the development of the layers can include an exposure to the ultraviolet light source for a few seconds through the mask. The areas of the layers which are exposed stay, and the rest of the layers are developed.

In one embodiment, the developing light wavelength parameter can be related to the thickness of the layers, with thinner layers corresponding to shorter wavelengths. This can permit a reduced aspect ratio and a reduced minimum feature size.

In one embodiment, various chemicals may be used for permanently giving the layers the desired property variations. The chemicals can include but not be limited to poly(methyl methacrylate) (PMMA), poly(methyl glutarimide) (PMGI), phenol formaldehyde resin (DNQ/Novolac), and SU-8. In one embodiment, chemicals can be applied as a liquid and, generally, spin-coated to ensure uniformity of thickness.

In one embodiment, processing the layers further comprises curing the layers using a heat source. The heat source can generate heat of a predetermined temperature of approximately 120° C. to approximately 140° C. in approximately 45 minutes. In one embodiment, the heat source can comprise an oven. The oven can have a temperature uniformity of approximately ±0.5% of the predetermined temperature. Moreover, the oven can comprise low particulate environmental controls to protect contamination, for example, using HEPA filtration of the air inside the oven. In one embodiment, the HEPA filter use can produce Class 10 (ISO Class 4) air quality. Moreover, the oven can be configured to have low oxygen levels to prevent oxidation of any of the layers.

Figure 7:
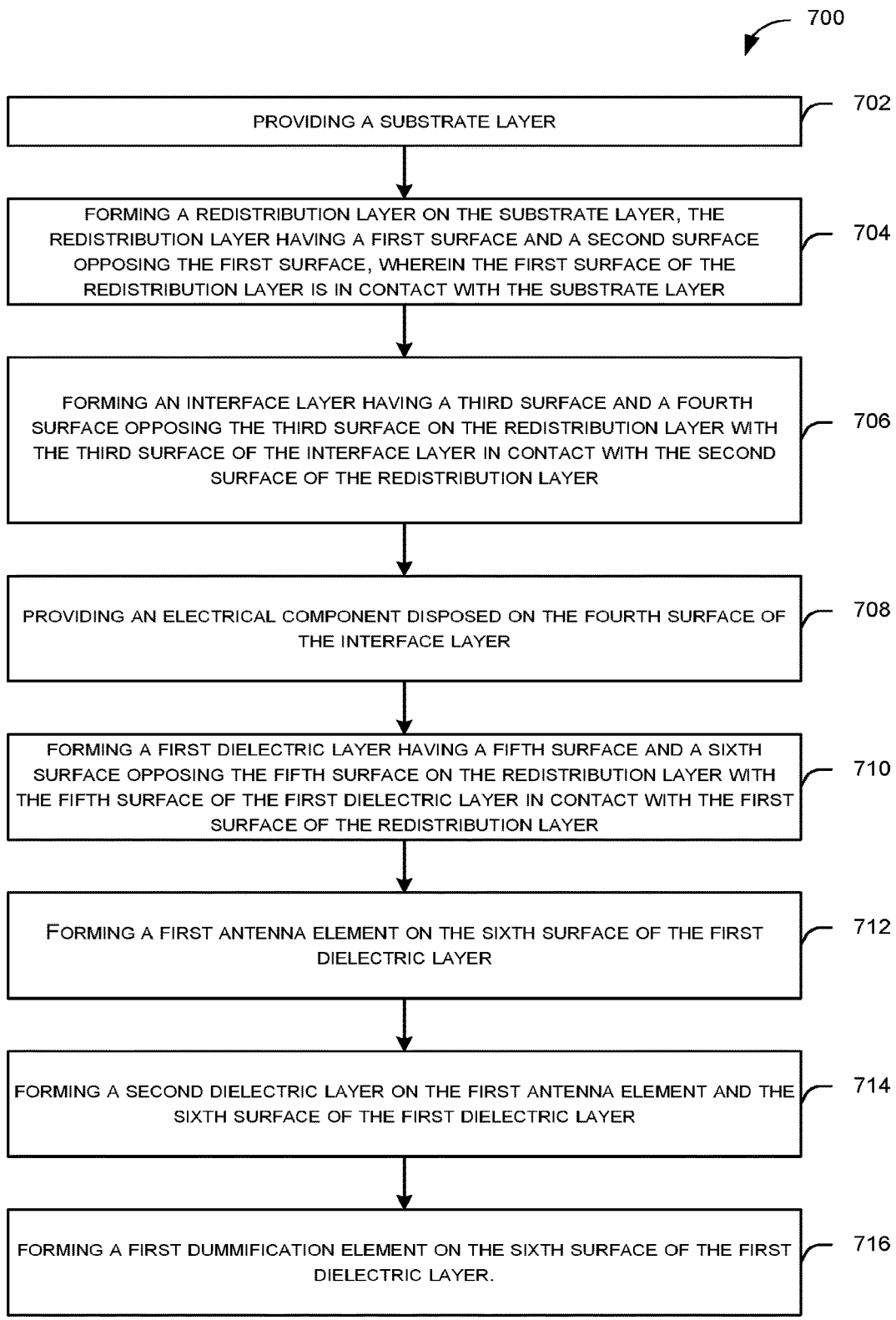
FIG. 7 shows a diagram of an example flow chart for the fabrication of an example of a semiconductor package (e.g., a millimeter (mm)-wave antenna package) in accordance with example embodiments of the systems and methods disclosed herein.

FIG. 7 shows a diagram of an example diagram 700 for an example operational flow for the fabrication of an example antenna package (e.g., the millimeter-wave antenna package), in accordance with various example embodiments of the disclosure. In block 702, a substrate layer can be provided. In block 704, a redistribution layer on the substrate layer can be formed, with the redistribution layer having a first surface and a second surface opposing it, wherein the first surface of the redistribution layer is in contact with the substrate layer. In block 706, an interface layer can be formed having a third surface and a fourth surface opposing the third surface on the redistribution layer, with the third surface of the interface layer in contact with the second surface of the redistribution layer. In block 708, an electrical component can be provided, with the electrical component being disposed on the fourth surface of the interface layer. In block 710, a first dielectric layer can be formed having a fifth surface and a sixth surface opposing the fifth surface on the redistribution layer with the fifth surface of the first dielectric layer in contact with the first surface of the redistribution layer. In block 712, a first antenna element can be formed on the sixth surface of the first dielectric layer. In block 714, a second dielectric layer can be formed on the first antenna element and the sixth surface of the first dielectric layer. In block 716, a first dummification element can be formed on the sixth surface of the first dielectric layer.

It will be appreciated that the apparatus described herein may be any suitable type of microelectronics packaging and configurations thereof, including, for example, system in a package (SIP), system on a package (SOP), package on package (PoP), interposer package, 3D stacked package, etc. In fact, any suitable type of microelectronic components may be provided in the antenna packages as described herein. For example, microcontrollers, microprocessors, baseband processors, digital signal processors, memory dies, field gate arrays, memory dies, logic gate dies, passive component dies, MEMSs, surface mount devices, application specific integrated circuits, baseband processors, amplifiers, filters, combinations thereof, or the like may be packaged in the board substrates and/or package substrates as disclosed herein. The antenna packages, as disclosed herein, may be provided in any variety of electronic devices, including consumer, industrial, military, communications, infrastructural, and/or other electronic devices.

The antenna packages, as described herein, may be used to house one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system, and the one or more processors and any chipsets included in an electronic device may be from a family of Intel® processors and chipsets, such as the Intel® Atom® processor(s) family or Intel-64 processors (e.g., Sandy Bridge®, Ivy Bridge®, Haswell®, Broadwell®, Skylake®, etc.).

Additionally or alternatively, the antenna packages, as described herein, may be used to house one or more memory chips. The memory may include one or more volatile and/or non-volatile memory devices, including but not limited to, magnetic storage devices, read-only memory (ROM), random access memory (RAM), dynamic RAM (DRAM), static RAM (SRAM), synchronous dynamic RAM (SDRAM), double data rate (DDR), SDRAM (DDR-SDRAM), RAMBUS DRAM (RDRAM), flash memory devices, electrically erasable programmable read-only memory (EEPROM), non-volatile RAM (NVRAM), universal serial bus (USB) removable memory, or combinations thereof.

In example embodiments, the electronic device in which antenna packages are provided may be a computing device. Such a computing device may house one or more boards on which antenna packages may be disposed. The board may include a number of components, including but not limited to, a processor and/or at least one communication chip. The processor may be physically and electrically connected to a board through, for example, electrical connections of the antenna packages. The computing device may further include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

Figure 8:
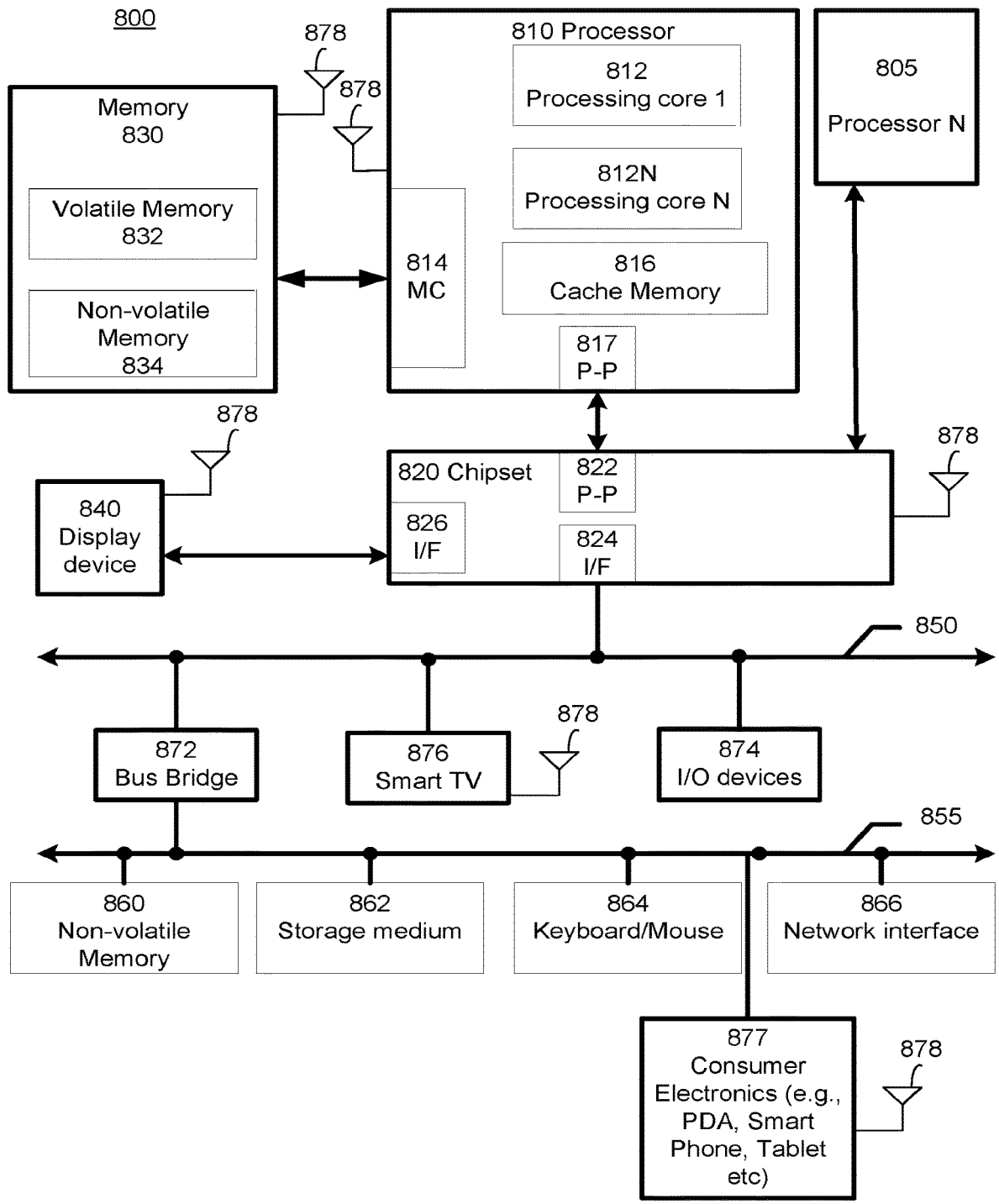
FIG. 8 illustrates a system level diagram, according to one embodiment of the disclosure.

FIG. 8 illustrates a system level diagram, according to one embodiment of the disclosure. In one embodiment, system 800 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 800 can include a system on a chip (SOC) system.

In one embodiment, processor 810 has one or more processing cores 812 and 812N, where 812N represents the Nth processor core inside processor 810, where N is a positive integer. In one embodiment, system 800 includes multiple processors including 810 and 805, where processor 805 has logic similar or identical to the logic of processor 810. In some embodiments, processing core 812 includes, but is not limited to, pre-fetch logic to fetch instructions, decode logic to decode the instructions, execution logic to execute instructions and the like. In some embodiments, processor 810 has a cache memory 816 to cache instructions and/or data for system 800. Cache memory 816 may be organized into a hierarchal structure including one or more levels of cache memory.

In some embodiments, processor 810 includes a memory controller 814, which is operable to perform functions that enable the processor 810 to access and communicate with memory 830 that includes a volatile memory 832 and/or a non-volatile memory 834. In some embodiments, processor 810 is coupled with memory 830 and chipset 820. Processor 810 may also be coupled to a wireless antenna 878 to communicate with any device configured to transmit and/or receive wireless signals. In one embodiment, the wireless antenna interface 878 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 832 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 834 includes, but is not limited to, flash memory, phase change memory (PCM), read-only memory (ROM), electrically erasable programmable read-only memory (EEPROM), or any other type of non-volatile memory device.

Memory 830 stores information and instructions to be executed by processor 810. In one embodiment, memory 830 may also store temporary variables or other intermediate information while processor 810 is executing instructions. In the illustrated embodiment, chipset 820 connects with processor 10 via Point-to-Point (PtP or P-P) interfaces 817 and 822. Chipset 820 enables processor 810 to connect to other elements in system 800. In some embodiments of the disclosure, interfaces 817 and 822 operate in accordance with a PtP communication protocol such as the Intel® QuickPath Interconnect (QPI) or the like. In other embodiments, a different interconnect may be used.

In some embodiments, chipset 820 is operable to communicate with processor 810, 805N, display device 840, and other devices 872, 876, 874, 860, 862, 864, 866, 877, etc. Chipset 820 may also be coupled to a wireless antenna 878 to communicate with any device configured to transmit and/or receive wireless signals.

Chipset 820 connects to display device 340 via interface 826. Display 840 may be, for example, a liquid crystal display (LCD), a plasma display, cathode ray tube (CRT) display, or any other form of visual display device. In some embodiments of the disclosure, processor 810 and chipset 820 are merged into a single SOC. In addition, chipset 820 connects to one or more buses 850 and 855 that interconnect various elements 874, 860, 862, 864, and 866. Buses 850 and 855 may be interconnected together via a bus bridge 872. In one embodiment, chipset 820 couples with a non-volatile memory 860, a mass storage device(s) 862, a keyboard/mouse 864, and a network interface 866 via interface 824 and/or 804, smart TV 876, consumer electronics 877, etc.

In one embodiment, mass storage device 862 includes, but is not limited to, a solid state drive, a hard disk drive, a universal serial bus flash memory drive, or any other form of computer data storage medium. In one embodiment, network interface 866 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 8 are depicted as separate blocks within the system 800, the functions performed by some of these blocks may be integrated within a single semiconductor circuit or may be implemented using two or more separate integrated circuits. For example, although cache memory 816 is depicted as a separate block within processor 810, cache memory 816 (or selected aspects of 816) can be incorporated into processor core 812.

According to example embodiments of the disclosure, there may be a semiconductor package. The semiconductor package may comprise a redistribution layer having a first surface and a second surface opposing the first surface and an interface layer having a third surface and a fourth surface opposing the third surface disposed over the redistribution layer with the third surface of the interface layer contacting the first surface of the redistribution layer. The semiconductor package may comprise an electrical component disposed on the fourth surface of the interface layer. The semiconductor package may comprise a first dielectric layer having a fifth surface and a sixth surface opposing the fifth surface disposed over the redistribution layer with the fifth surface of the first dielectric layer contacting the second surface of the redistribution layer. A first antenna element disposed on the sixth surface of the first dielectric layer; a second dielectric layer disposed over the first antenna element and the sixth surface of the first dielectric layer; and a second antenna element disposed on the second dielectric layer may further comprise the semiconductor package.

Implementation may include one or more of the following features. The semiconductor package may further comprise a first dummification element disposed on the sixth surface of the first dielectric layer, wherein at least a portion of first dummification element may have at least one predetermined dimension, wherein the predetermined dimension is less than about half of a wavelength associated with radiation generated by the first antenna element or the second antenna element. The semiconductor package may further comprise a second dummifcation element disposed on the sixth surface of the first dielectric layer. The semiconductor package may further comprise a third layer, which may comprise a buildup layer or a solder mask layer, disposed on the second antenna element and the second dummifcation element. The redistribution layer may comprise one or more interconnect layers, wherein each of the one or more interconnect layers have a first thickness less than a second thickness of the first dielectric layer and wherein the redistribution layer is within a range of about 80% and 120% of a combined thickness of the first dielectric layer and the second dielectric layer. The interface layer may comprise at least one of: (i) a buildup layer, or (ii) a solder mask layer. The first antenna element may comprise one or more of: (i) a patch antenna, (ii) a spiral antenna, (iii) dipole antenna, or (iv) a monopole antenna. One or more of the first or second antenna may comprise at least a portion of the phased array. The semiconductor package may comprise a via through the first dielectric, wherein the via is electrically connected to a first pad disposed on the second surface of the redistribution layer and to the first antenna element.

According to example embodiments of the disclosure, there may be a method for fabricating a semiconductor package. The method may comprise: providing a substrate layer; forming a redistribution layer on the substrate layer, the redistribution layer having a first surface and a second surface opposing the first surface, wherein the first surface of the redistribution layer is in contact with the substrate layer; forming an interface layer having a third surface and a fourth surface opposing the third surface on the redistribution layer with the third surface of the interface layer in contact with the second surface of the redistribution layer; providing an electrical component disposed on the fourth surface of the interface layer; removing the substrate layer from the first surface of the redistribution layer; forming a first dielectric layer having a fifth surface and a sixth surface opposing the fifth surface on the redistribution layer with the fifth surface of the first dielectric layer in contact with the first surface of the redistribution layer; forming a first antenna element on the sixth surface of the first dielectric layer; forming a second dielectric layer on the first antenna element and the sixth surface of the first dielectric layer; and forming a second antenna element on the second dielectric layer.

Implementation may include one or more of the following features. The first dummification element may be formed on the sixth surface of the first dielectric layer and the element may formed using a plating process. The method for forming the first dummifcation element may comprise forming at least a portion of the first dummification element to have at least one predetermined dimension, wherein the predetermined dimension is less than about half of a wavelength associated with radiation generated by the first antenna element or the second antenna element. The method may comprise forming a second dummification element on the second dielectric layer and may comprise forming a third layer on the second antenna element and the second dummification element. Forming the third layer may comprise forming a buildup layer or a solder mask layer. Forming the redistribution layer may comprise forming one or more interconnect layers having one or more dielectric layers with one or more metal traces formed on the one or more dielectric layers. Forming the interface layer may comprise forming a buildup layer or a solder mask layer. Forming the first dielectric layer may comprise forming the first dielectric layer using a lamination process.

According to example embodiments of the disclosure, there may be a device. The device may comprise a semiconductor package, which may comprise: a redistribution layer having a first surface and a second surface opposing the first surface and an interface layer having a third surface and a fourth surface opposing the third surface disposed over the redistribution layer with the third surface of the interface layer contacting the first surface of the redistribution layer. The semiconductor package may comprise an electrical component disposed on the fourth surface of the interface layer. The semiconductor package may comprise a first dielectric layer having a fifth surface and a sixth surface opposing the fifth surface disposed over the redistribution layer with the fifth surface of the first dielectric layer contacting the second surface of the redistribution layer. A first antenna element disposed on the sixth surface of the first dielectric layer; a second dielectric layer disposed over the first antenna element and the sixth surface of the first dielectric layer; and a second antenna element disposed on the second dielectric layer may further comprise the semiconductor package.

Implementation may include one or more of the following features. The device comprising a semiconductor package may further comprise a first dummification element disposed on the sixth surface of the first dielectric layer, wherein at least a portion of first dummification element may have at least one predetermined dimension, wherein the predetermined dimension is less than about half of a wavelength associated with radiation generated by the first antenna element or the second antenna element. The device may further comprise a second dummifcation element disposed on the sixth surface of the first dielectric layer. The device may further comprise a third layer, which may comprise a buildup layer or a solder mask layer, disposed on the second antenna element and the second dummifcation element. The redistribution layer may comprise one or more interconnect layers, wherein each of the one or more interconnect layers have a first thickness less than a second thickness of the first dielectric layer and wherein the redistribution layer is within a range of about 80% and 120% of a combined thickness of the first dielectric layer and the second dielectric layer. The interface layer may comprise at least one of: (i) a buildup layer, or (ii) a solder mask layer. The first antenna element may comprise one or more of: (i) a patch antenna, (ii) a spiral antenna, (iii) dipole antenna, or (iv) a monopole antenna. One or more of the first or second antenna may comprise at least a portion of the phased array. The device may comprise a via through the first dielectric, wherein the via is electrically connected to a first pad disposed on the second surface of the redistribution layer and to the first antenna element.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

While the disclosure includes various embodiments, including at least a best mode, it is to be understood that many alternatives, modifications, and variations will be apparent to those skilled in the art, in light of the foregoing description. Accordingly, the disclosure is intended to embrace all such alternatives, modifications, and variations that fall within the scope of the included claims. All matters disclosed herein or shown in the accompanying drawings are to be interpreted in an illustrative and non-limiting sense.

This written description uses examples to disclose certain embodiments of the disclosure, including the best mode, and also to enable any person skilled in the art to practice certain embodiments of the disclosure, including making and using any apparatus, devices, or systems, and performing any incorporated methods and processes. The patentable scope of certain embodiments of the disclosure is defined in the claims and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A semiconductor package, comprising:
a redistribution layer having a first surface and a second surface opposing the first surface;
an interface layer having a third surface and a fourth surface opposing the third surface disposed over the redistribution layer with the third surface of the interface layer contacting the first surface of the redistribution layer;
an electrical component disposed on the fourth surface of the interface layer;
a first dielectric layer having a fifth surface and a sixth surface opposing the fifth surface disposed over the redistribution layer with the fifth surface of the first dielectric layer contacting the second surface of the redistribution layer;
a first antenna element disposed on the sixth surface of the first dielectric layer;
a second dielectric layer disposed over the first antenna element and the sixth surface of the first dielectric layer;
a second antenna element disposed on the second dielectric layer; and
a first dummification element disposed on the sixth surface of the first dielectric layer.

2. The semiconductor package of claim 1, wherein at least a portion of the first dummification element has at least one predetermined dimension, wherein the predetermined dimension is less than about half of a wavelength associated with radiation generated by the first antenna element or the second antenna element.

3. The semiconductor package of claim 1, further comprising a second dummification element disposed on the sixth surface of the first dielectric layer.

4. The semiconductor package of claim 3, further comprising a third layer disposed on the second antenna element and the second dummification element.

5. The semiconductor package of claim 4, wherein the third layer comprises a buildup layer or a solder mask layer.

6. The semiconductor package of claim 1, wherein the redistribution layer comprising one or more interconnect layers, wherein each of the one or more interconnect layers has a first thickness less than a second thickness of the first dielectric layer.

7. The semiconductor package of claim 1, wherein a thickness of the redistribution layer is within a range of about 80% and 120% of a combined thickness of the first dielectric layer and the second dielectric layer.

8. The semiconductor package of claim 1, wherein the interface layer comprises at least one of: (i) a buildup layer, or (ii) a solder mask layer.

9. The semiconductor package of claim 1, wherein the first antenna element comprises one or more of: (i) a patch antenna, (ii) a spiral antenna, (iii) a dipole antenna, or (iv) a monopole antenna.

10. The semiconductor package of claim 1, wherein one or more of the first or second antenna elements comprise at least a portion of a phased array.

11. The semiconductor package of claim 1, further comprising a via through the first dielectric layer, wherein the via is electrically connected to a first pad disposed on the second surface of the redistribution layer and to the first antenna element.

12. A method for fabricating a semiconductor package, the method comprising:
providing a substrate layer;
forming a redistribution layer on the substrate layer, the redistribution layer having a first surface and a second surface opposing the first surface, wherein the first surface of the redistribution layer is in contact with the substrate layer;
forming an interface layer having a third surface and a fourth surface opposing the third surface on the redistribution layer with the third surface of the interface layer in contact with the second surface of the redistribution layer;
providing an electrical component disposed on the fourth surface of the interface layer;
removing the substrate layer from the first surface of the redistribution layer;
forming a first dielectric layer having a fifth surface and a sixth surface opposing the fifth surface on the redistribution layer with the fifth surface of the first dielectric layer in contact with the first surface of the redistribution layer;
forming a first antenna element on the sixth surface of the first dielectric layer;
forming a second dielectric layer on the first antenna element and the sixth surface of the first dielectric layer;
forming a second antenna element on the second dielectric layer; and
forming a first dummification element on the sixth surface of the first dielectric layer.

13. The method of claim 12, wherein forming the first dummification element comprises using a plating process.

14. The method of claim 12, wherein forming the first dummification element comprises forming at least a portion of the first dummification element to have at least one predetermined dimension, wherein the predetermined dimension is less than about half of a wavelength associated with radiation generated by the first antenna element or the second antenna element.

15. The method of claim 12, further comprising forming a second dummification element on the second dielectric layer.

16. The method of claim 15, further comprising forming a third layer on the second antenna element and the second dummification element.

17. The method of claim 16, wherein forming the third layer comprises forming a buildup layer or a solder mask layer.

18. The method of claim 12, wherein forming the redistribution layer comprises forming one or more interconnect layers having one or more dielectric layers with one or more metal traces formed on the one or more dielectric layers.

* * * * *